(12) United States Patent
Spencer

(10) Patent No.: US 7,109,789 B2
(45) Date of Patent: Sep. 19, 2006

(54) MODULATOR—AMPLIFIER

(75) Inventor: Michael E. Spencer, Escondido, CA (US)

(73) Assignee: American Technology Corporation, San Diego, CA (US)

( * ) Notice: Subject to any disclaimer, the term of this patent is extended or adjusted under 35 U.S.C. 154(b) by 0 days.

(21) Appl. No.: 10/501,896

(22) PCT Filed: Jan. 21, 2003

(86) PCT No.: PCT/US03/01854

§ 371 (c)(1),
(2), (4) Date: Jul. 19, 2004

(87) PCT Pub. No.: WO03/065570

PCT Pub. Date: Aug. 7, 2003

(65) Prior Publication Data
US 2005/0152561 A1 Jul. 14, 2005

Related U.S. Application Data

(60) Provisional application No. 60/350,414, filed on Jan. 18, 2002.

(51) Int. Cl.
H03F 3/38 (2006.01)
(52) U.S. Cl. ........................ 330/10; 330/251
(58) Field of Classification Search ............... 330/10, 330/251, 207 A; 381/77
See application file for complete search history.

(56) References Cited

U.S. PATENT DOCUMENTS

| | | | |
|---|---|---|---|
| 1,616,639 A | 2/1927 | Sprague | |
| 1,951,669 A | 3/1934 | Ramsey | |
| 2,461,344 A | 2/1949 | Olson | |
| 3,012,222 A | 12/1961 | Hagemann | |
| 3,398,810 A | 8/1968 | Clark, III | |
| 3,461,421 A | 8/1969 | Stover | |
| 3,612,211 A | 10/1971 | Clark, III | |
| 3,613,069 A | 10/1971 | Cary, Jr. et al. | |
| 3,710,332 A | 1/1973 | Tischner et al. | |

(Continued)

FOREIGN PATENT DOCUMENTS

EP 0 973 152 1/2000

(Continued)

OTHER PUBLICATIONS

Pompei; *The Use of Airborne Ultrasonics for Generating Audible Sound Beams*; Presented at the 105th Convention Sep. 26-29, 1998.

(Continued)

*Primary Examiner*—Henry Choe
(74) *Attorney, Agent, or Firm*—Thorpe North & Western LLP

(57) ABSTRACT

A modulator-amplifier configured for use in parametric sound reproduction systems, including an input configured for receiving at least one input signal, a reference signal generator configured for generating a reference signal, and a comparator stage coupled to the input and the reference signal generator, the comparator stage configured for detecting relationships between a first signal based on the input signal and the reference signal. A switching power stage coupled to the comparator is configured to receive a second signal derived from a combination of an output from the comparators and the input signal, wherein there is a non-linear relationship between the input signal and the timing of state transitions in the switching power stage for the purpose of generating an output that has been shifted in frequency relative to a frequency of the input signal, and which includes at least one sideband.

39 Claims, 34 Drawing Sheets

U.S. PATENT DOCUMENTS

| | | | |
|---|---|---|---|
| 3,742,433 | A | 6/1973 | Kay et al. |
| 3,836,951 | A | 9/1974 | Geren et al. |
| 4,166,197 | A | 8/1979 | Moog et al. |
| 4,295,214 | A | 10/1981 | Thompson |
| 4,378,596 | A | 3/1983 | Clark |
| 4,418,404 | A | 11/1983 | Gordon et al. |
| 4,600,891 | A | 7/1986 | Taylor, Jr. et al. |
| 4,823,908 | A | 4/1989 | Tanaka et al. |
| 4,991,148 | A | 2/1991 | Gilchrist |
| 5,095,509 | A | 3/1992 | Volk |
| 5,115,672 | A | 5/1992 | McShane et al. |
| 5,317,543 | A | 5/1994 | Grosch |
| 5,357,578 | A | 10/1994 | Taniishi |
| 5,539,705 | A | 7/1996 | Akerman et al. |
| 5,745,582 | A | 4/1998 | Shimpuku et al. |
| 5,758,177 | A | 5/1998 | Gulick et al. |
| 5,859,915 | A | 1/1999 | Norris |
| 5,889,870 | A | 3/1999 | Norris |
| 6,011,855 | A | 1/2000 | Selfridge et al. |
| 6,052,336 | A | 4/2000 | Lowrey, III |
| 6,064,259 | A * | 5/2000 | Takita ............ 330/10 |
| 6,108,427 | A | 8/2000 | Norris et al. |
| 6,229,899 | B1 | 5/2001 | Norris et al. |
| 6,232,833 | B1 * | 5/2001 | Pullen ............ 330/10 |
| 6,359,990 | B1 | 3/2002 | Norris |
| 6,378,010 | B1 | 4/2002 | Burks |
| 6,445,804 | B1 | 9/2002 | Hirayanagi |
| 6,768,376 | B1 * | 7/2004 | Hoyt et al. ........ 330/10 |
| 6,859,096 | B1 * | 2/2005 | Tanaka et al. ...... 330/10 |

FOREIGN PATENT DOCUMENTS

| | | |
|---|---|---|
| JP | H2-265400 | 10/1990 |
| WO | WO 01/08449 | 2/2001 |
| WO | WO 01/52437 | 7/2001 |

OTHER PUBLICATIONS

Crandall; *The Air-Damped Vibrating System: Theoretical Calibration of the Condenser Transmitter*, pp. 449-460.

Kamakura, et al.; *Suitable Modulation of the Carrier Ultrasound for Parametric Loudspeaker*; Acustica vol. 73 (1991).

Yoneyama, et al.; *The audio spotlight: An application of nonlinear interaction of sound waves to a new type of loudspeaker design*; Acoustical Society of America; May 1983; pp. 1532-1536.

Havelock, et al.; *Directional Loudspeakers Using Sound Beams*; J. Audio Eng. Soc., vol. 48, No. 10, Oct. 2000; pp. 908-916.

Helhotz; *Excerpts from On DCombination Tones*; pp. 228-238.

Berktay, et al; *Nearfield effects in end-fire line arrays*; The Journal of the Acoustical Society of America; 1973; pp. 550-556.

Kamakura, et al.; *A Study for the Realization of a Parametric Loudspeaker*, 1985; pp. 1-18.

Makarov, et al.; *Parametric Acoustic Nondirectional Radiator*, Acustica vol. 77 (1992); pp. 240-241.

Aoki, et al.; *Parametric Loudspeaker—Characteristics of Acoustic Field and Suitable Modulation of Carrier Ultrasound*; Scripta Technica, Inc. 1992; pp. 76-82.

Westervelt; *Parametric Acoustic Array*; The Journal of the Acoustical Society of America; Apr. 1983; pp. 535-537.

Muir, et al.; *Parametric Acoustic Transmitting Arrays*; The Journal of the Acousticval Society of America; 1972; pp. 1481-1485.

Berktay, *Possible Exploitation of Non-Linear Acoustics in Underwater Transmitting Applications*; J. Sound Vib. 1965; pp. 435-461.

Polaroid; *Ultrasonic Ranging System*.

Piwnicki, Konrad, "Modulation Methods Related to Sine-Wave Crossing" IEEE Transactions on Communications, 1983, pp. 503-508, vol. COM-31, No. 4.

Marvasti, Farokh, "Modulation Methods Related to Sine Wave Crossings" IEEE Transactions on Communications, 1985, pp. 177-178, vol. COM-33, No. 2.

* cited by examiner

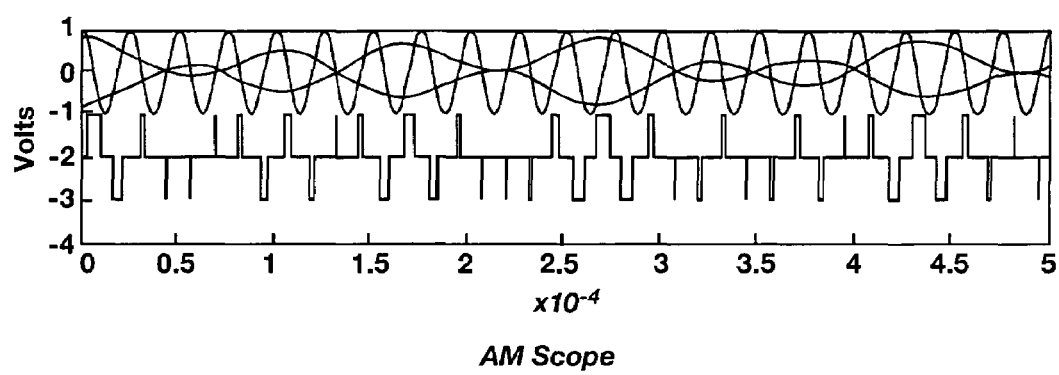
AM Scope
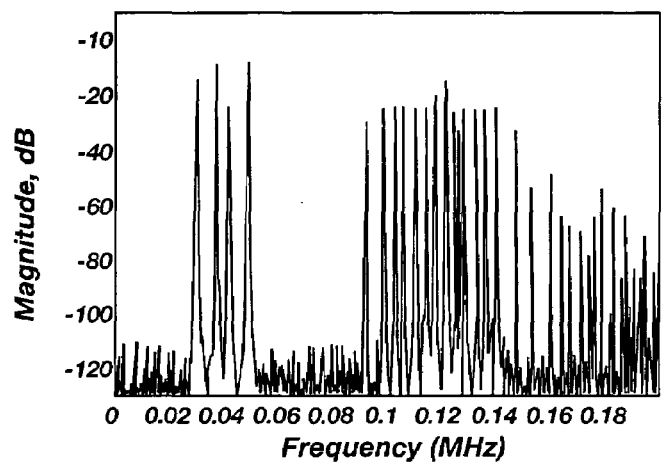
FIG. 15

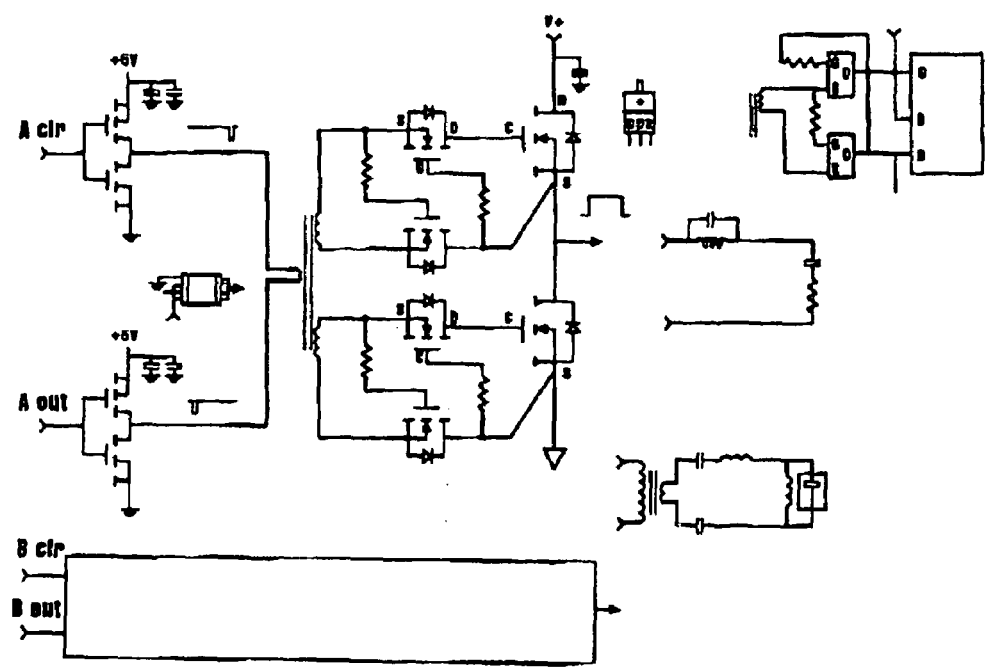
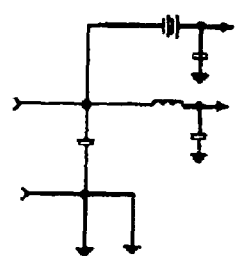
*FIG. 24*

MODULATOR—AMPLIFIER

This application claims priority of U.S. Provisional Application Ser. No. 60/350,414 filed Jan. 18, 2002, which is hereby incorporated herein by reference for the relevant teachings consistent herewith.

BACKGROUND OF THE INVENTION

1. Field of the Invention

The present invention relates generally to modulators and amplifiers used in communication and reproduction of audio signals. More particularly, the present invention relates to amplification and modulation equipment where a carrier is modulated in at least one sideband in parametric sound reproduction.

2. Related Art

Modulation of a carrier signal to incorporate audio signal information is well known. Single side band (SSB) and double side band (DSB or AM) modulation including "upper" and "lower" sidebands have been used in radio frequency (RF) communication equipment for many decades to transmit and reproduce audio information. More recently, in the field of parametric audio reproduction, modulation of an ultrasonic carrier signal has been performed. The signal is amplified and fed trough an ultrasonic transducer to produce an audible reproduction of the audio information.

Typically, at least one sideband is used to carry audio signal information. Audio information can be reproduced in a parametric array comprising a fluid medium wherein the transducer is located. The fluid is typically air, but can be other fluids, such as water, for example. The array medium is excited by the transducer at the modulated carrier frequency; and, typically, by non-linear interaction of molecules of the air (or water) medium, audible audio waves are produced. Those audible waves reproduce the audio information in the modulated carrier signal. It will be appreciated that other signal processing can be done, but toward that subject, adherence to the subject matter at hand requires forbearance in setting out more.

Parametric sound reproduction has numerous potential applications. The relatively large power requirements of sound reproduction using this technique is an issue recognized across a range of these applications. Inherently, this technique requires more power than direct excitation of the medium at an audible frequency (audio frequency). For example, conventional audio systems directly generate compression waves reproducing audio information. But in parametric reproduction, the compression waves are created at a higher frequency than that of the audio signal, typically 10 or more times the frequency. Thus changing the excursion direction of the transducer driven element and the coupled medium takes place typically at least this many more times, each change consuming energy. Development of efficient techniques for modulation and amplification of a signal to be sent to the transducer (speaker) as a modulated carrier signal can be of significant benefit in parametric sound reproduction applications. This is because the process of parametric sound reproduction is so inherently power-hungry, improvements in power efficiencies go directly to the bottom line of better reproduction, lower power consumption, and enabling more volume at the distances from the transducer within the array that are of interest in the particular application, especially where that distance is large and/or the desired sound pressure level (SPL) is large at the distance of interest.

Furthermore, the processes of modulation of the carrier, and amplification of the audio source signal, can themselves introduce distortion. For example, audible artifacts of switching in an output stage of a switching amplifier can be problematic. Further, in switching amplification and modulation at frequencies close to the carrier frequency, e.g. about ten times the frequency or less, very noticeable and distracting artifacts are present using conventional techniques. These distortions/artifacts can be noticeable, and distracting, when heard by a listener in a parametric array. They can generally degrade the quality of the audio information heard. Much work has been done in attempting to reduce such undesirable artifacts and distortion. However, due to the necessity for relatively high signal strength, and for increased power in the transducer, these problems remain apparent, and can degrade the listening experience of the hearer in the parametric array.

Improvements in power efficiency and audible signal quality will go far to increase acceptance of parametric sound reproduction technologies. They can be of benefit in other areas where modulation of a reference or carrier signal is used, as well. However, it will be understood that for sake of clarity and understanding, the invention will be set forth in the application by means of example. Most of the discussion of the details of implementation will be relevant to parametric sound reproduction using an ultrasonic carrier. But the improvements disclosed herein may well have important applications in other areas.

SUMMARY OF THE INVENTION

It has been recognized that it would be advantageous to develop a system for carrier modulation and power amplification of a modulated ultrasonic frequency signal for sound reproduction in a parametric array. The following numbered paragraphs summarize the subject matter of the invention:

1. A modulator-amplifier configured for use in parametric sound reproduction systems reproducing audio information in a medium, comprising:
   an input configured for receiving at least one input signal including audio information;
   at least one reference signal generator configured for generating at least one reference signal;
   at least one comparator coupled to the input and the reference signal generator, configured for detecting a relationship between a) a first signal based on the input signal, and b) at least one reference signal and to generate a second signal based thereon;
   at least one switching power stage, coupled to the at least one comparator, configured to receive the second signal derived from an output from the at least one comparator;
   wherein there is a non-linear relationship between the input signal and the timing of state transitions in the switching power stage for the purpose of generating an output that has been shifted in frequency relative to a frequency of the input signal and which includes at least one sideband including audio information.

2. A modulator-amplifier as set forth in claim 1, wherein the medium is air.

3. A modulator-amplifier as set forth in claim 1, wherein the medium is water.

4. A modulator-amplifier as set forth in claim 1, wherein the output comprises two sidebands.

5. A modulator-amplifier as set forth in claim 1, wherein the output comprises two sidebands and one of conditions of
   a) the audio information being divided between them unevenly, and, b) the strength of the signal is divided between them unevenly, obtains.

6. A modulator-amplifier as set forth in claim 1, wherein the apparatus can perform SSB and DSB modulation.

7. A modulator-amplifier as set forth in claim 1, wherein the switching is one of bi-level, tri-level, 4-level, and 5-level switching.

8. A modulator-amplifier as set forth in claim 1, wherein the reference signal has a waveform that is one of sinusoidal, triangle, and rectiform.

9. A modulator-amplifier as set forth in claim 1, wherein the modulator-amplifier is implemented in an analog manner?

10. A modulator-amplifier as set forth in claim 1, wherein the modulator-amplifier is implemented in a digital manner.

11. A modulator-amplifier as set forth in claim 10, further comprising a gate array.

12. A modulator-amplifier as set forth in claim 11, wherein the gate array is field-programmable.

13. A modulator-amplifier as set forth in claim 1, further comprising a carrier level controller, whereby output power can be varied by varying the amplitude of the carrier signal.

14. A modulator-amplifier as set forth in claim 1, wherein output power can be varied by varying the amplitude of the output signal.

15. A modulator-amplifier as set forth in claim 14, wherein the output power can be adjusted by adjusting the voltage swing between states in the switching power stage.

16. A modulator-amplifier as set forth in claim 1, wherein the output signal amplitude is multiplied integer value in the output stage.

17. A modulator-amplifier as set forth in claim 13, further comprising a signal processor which generates a level signal based on the level of the input signal, and wherein the carrier is AM modulated in accordance with the level signal.

18. A modulator-amplifier as set forth in claim 17, wherein the carrier level controller modulates the amplitude of the reference signal based upon the input signal, whereby power is added to provide an increased sound pressure level in the medium acted on by a parametric reproduction system, and reduced to reduce sound pressure level in the medium.

19. A modulator-amplifier as set forth in claim 1, wherein a switching frequency of the switching power output stage is less than ten times the frequency of the reference signal.

20. A modulator-amplifier as set forth in claim 19, wherein the switching frequency is less than 6 times the frequency of the reference signal.

21. A modulator-amplifier as set forth in claim 19, wherein the switching frequency is an integer multiple of the carrier frequency.

22. A modulator-amplifier as set forth in claim 1, wherein a relationship between the input signal and the timing of state changes in the switching output stage is based on an arcsine function.

23. A modulator-amplifier as set forth in claim 22, wherein the function is chosen so as to minimize switching-induced distortion of audio information in the input signal.

24. A modulator-amplifier as set forth in claim 1, wherein the modulator-amplifier is configured to process an input signal comprising a sinusoidal waveform.

25. A modulator-amplifier as set forth in claim 24, configured to process an input signal comprising an in-phase signal and a quadrature signal.

26. A modulator-amplifier as set forth in claim 1, wherein the reference signal frequency is based on a frequency of AC wall-socket power to which the modulator-amplifier is connected.

27. A modulator-amplifier as set forth in claim 26, further comprising a protection circuit which prevents invalid conditions arising from the AC power deviating from a pre-selected range of parameter values.

28. A modulator-amplifier as set forth in claim 1, wherein the modulator-amplifier is configured so as to be operable as one of: a) a band-pass amplifier; b) a part of one of an AM transmitter and SSB transmitter; c) as part of a SONAR system; d) as part of a diagnostic ultrasound system; and, e) as a frequency translating amplifier.

29. A modulator-amplifier as set forth in claim 7, wherein switching occurs at one of 2, 3, 4, 5, and 6 times the carrier frequency.

30. A modulator-amplifier as set forth in claim 29, where in the modulator is of a type which is one of upper sideband, lower sideband, both upper and lower sideband (AM).

31. A modulator-amplifier, comprising:
   an input configured for receiving at least one input signal including audio information;
   at least one reference signal generator configured for generating at least one reference signal;
   a switch mode modulator configured to modulate the reference signal, configured so that there is a non-linear relationship between the input signal and state transitions of the switching output waveform;
   the modulator-amplifier being configured for use in parametric sound reproduction systems reproducing audio information in a medium, the modulator-amplifier generating an output that has been shifted in frequency relative to a frequency of the input signal, and which includes at least one sideband.

32. A modulator-amplifier as set forth in claim 1, wherein the medium is air.

33. A modulator-amplifier as set forth in claim 1, wherein the reference signal is double sideband modulated.

34. A modulator-amplifier as set forth in claim 1, wherein the reference signal is lower-sideband modulated.

35. A modulator-amplifier as set forth in claim 1, wherein the output comprises two sidebands and one of conditions of a) the audio information being divided between them unevenly, and, b) the strength of the signal is divided between them unevenly, obtains.

36. A modulator-amplifier as set forth in claim 1, wherein the apparatus can both perform SSB and DSB modulation.

37. A modulator-amplifier as set forth in claim 1, wherein the reference signal is single-edge modulated.

38. A modulator-amplifier as set forth in claim 1, wherein the switching is one of bi-level, tri-level, 4-level, and 5-level switching.

39. A modulator-amplifier as set forth in claim 1, wherein the reference signal has a waveform that is one of sinusoidal and triangle wave.

40. A modulator-amplifier as set forth in claim 1, wherein the modulator-amplifier is implemented in a digital manner and the input signal is pulse-code modulated.

41. A modulator-amplifier as set forth in claim 31, further comprising a field programmable gate array.

42. A modulator-amplifier as set forth in claim 1, wherein sound pressure level in the medium can be varied by varying the amplitude of the carrier signal.

43. A modulator-amplifier as set forth in claim 1, wherein the output power can be adjusted by adjusting voltage swing in the switching power stage.

44. A modulator-amplifier as set forth in claim 43, wherein the output power can be adjusted by multiplying the amplitude by a real number value which can be adjusted.

45. A modulator-amplifier as set forth in claim 1, wherein the number of levels in the switching power stage is one plus an integer comprising 1, 2, 3, and 4.

46. A modulator-amplifier as set forth in claim 1, further comprising a dynamic carrier level controller.

47. A modulator-amplifier as set forth in claim 46, wherein the carrier level controller modulates the amplitude of the reference signal based upon the input signal, whereby power is added to provide an increased sound pressure level in the medium acted on by a parametric reproduction system, and reduced to reduce sound pressure level in the medium.

48. A modulator-amplifier as set forth in claim 1, wherein a switching frequency of the switching power output stage is less than ten times the frequency of the reference signal.

49. A modulator-amplifier as set forth in claim 49, wherein the switching frequency is one of 2, 4, and 8 times the frequency of the reference signal.

50. A modulator-amplifier as set forth in claim 19, wherein the switching frequency is an integer multiple of the carrier frequency, the integer being one of 2, 3, 4, 5, 6 and 7.

51. A modulator-amplifier as set forth in claim 1, wherein a relationship between the input signal and the timing of state changes in the switching output stage is based on an arcsine function.

52. A modulator-amplifier as set forth in claim 51, wherein the function is chosen so as to minimize switching-induced distortion of audio information in the input signal.

53. A modulator-amplifier as set forth in claim 31, wherein the modulator-amplifier is configured to process an input signal comprising a sinusoidal waveform.

54. A modulator-amplifier as set forth in claim 53, configured to process an input signal comprising an in-phase signal and a quadrature signal.

55. A modulator-amplifier as set forth in claim 1, wherein the reference signal frequency is proportional to a frequency of AC wall-socket power to which the modulator-amplifier is connected.

56. A modulator-amplifier as set forth in claim 55, further comprising a protection circuit which prevents invalid conditions arising from the AC power deviating from a pre-selected range of frequency parameter values.

57. A modulator-amplifier as set forth in claim 1, further comprising a power supply rejection circuit configured to mitigate noise and changes in the supply voltage.

58. A modulator-amplifier as set forth in claim 57, wherein the power supply rejection circuit employs a feed-forward amplitude/pulse-width adjustment technique for stabilizing triangle and sinusoidal reference signals.

59. A modulator-amplifier as set forth in claim 31, wherein the reference signal is modulated to include audio information on one of: a) a lower sideband; b) an upper sideband; and c) both upper and lower sidebands (AM).

60. A modulator-amplifier as set forth in claim 59, wherein the switching power stage has a number of levels equal to one of 2, 3, 4, and 5.

61. A modulator-amplifier as set forth in claim 60, wherein switching occurs at one of 2, 3, 4, 5 and 6 times the frequency of the reference signal.

62. A modulator-amplifier as set forth in claim 31, wherein the system is adaptable to one of a) frequency modulation; b) quadrature phase shift keying (QPSK) and quadrature amplitude modulation (QAM).

63. A system for generating an acoustic output reproducing an audio signal in an acoustic parametric array in an acoustic wave-transmitting medium, comprising:
   a modulator-amplifier which produces a modulated carrier wave output which comprises a carrier waveform at an ultrasonic frequency modulated so as to include a processed audio signal, which modulated carrier wave output is capable of driving a transducer so as to reproduce the audio signal in the parametric array, said modulator-amplifier including an event generator generating a signal based on comparison of an audio signal and a reference signal, and said modulator-amplifier further comprising a switching output stage, said event generator signaling the switching output stage, and wherein a timing of switching state transitions in the output stage is related to the audio signal by a non-linear function;
   an ultrasonic transducer which converts the modulated carrier wave output into an ultrasonic audio wave in a medium;
   whereby the pre-processed audio source signal is amplified and reproduced in the parametric array in the medium.

64. A system as set forth in claim 63, wherein the non-linear function comprises an arcsine function.

65. A system as set forth in claim 63, wherein the medium is air.

66. A system as set forth in claim 63, wherein the reference signal is one of a) upper sideband modulated; b) lower sideband modulated; c) double sideband modulated (AM).

67. A system as set forth in claim 63, wherein the combined modulator/amplifier can perform amplitude modulation and sideband modulation.

68. A system as set forth in claim 1, wherein the reference signal is sinusoidal and the event generator comprises at least one comparator.

69. A system as set forth in claim 1, wherein the combined modulator/amplifier is implemented digitally.

70. A system as set forth in claim 69, wherein the input signal is pulse code modulated.

71. A system as set forth in claim 63, wherein the modulator/amplifier comprises a gate array.

72. A system as set forth in claim 71 wherein the gate array is field-programmable.

73. A system as set forth in claim 63, wherein the modulator/amplifier comprises a switching power output stage wherein the number of steady-state levels is one plus an integer greater than zero and less than 8.

74. A system as set forth in claim 73, wherein the reference signal is one of a) single sideband, and b) double sideband modulated.

75. A system as set forth in claim 74, wherein the switching power output stage has a switching frequency that is one of 2, 3, 4, 5, and 6 times the reference signal frequency.

76. A system as set forth in claim 63 which can be adapted to perform one of: a) SSB; b) DSB; c) FM; d) QPSK and e) QAM modulation using the non-linear relationship of the audio signal to timing of state changes in the switching power output stage.

77. A system as set forth in claim 63, further comprising a power supply rejection circuit.

78. A system as set forth in claim 63, further comprising a dynamic carrier level controller which modulates the amplitude of the reference signal based on the input signal level.
79. A system as set forth in claim 78, wherein the carrier level controller modulates the amplitude of the carrier wave based upon an incoming audio signal level, whereby power is added to provide increased sound pressure and reduced to reduce sound pressure in the audio output in the medium based upon a sensed requirement of the source signal.
80. A system as set forth in claim 63, wherein the switching power output stage of the modamp has a switching frequency of less than ten times the carrier frequency.
81. A system as set forth in claim 63, further comprising a low-pass filter configured to remove artifacts of switching from the output signal.
82. A modulator-amplifier configured for use in parametric sound reproduction systems, comprising:
    A reference signal generator
    An event detector-signal generator comprising at least one configured for comparing an input signal with a reference signal and generating a timing signal based upon detected events in an input signal;
    A switching power output stage configured for modulating the reference signal based upon the timing signal, whereby modulation is integrated into power amplification;
    Wherein there is a non-linear relationship between the input signal and the timing of state transitions in the modulator-output stage.
83. A modulator-amplifier as set forth in claim 82, wherein said non-linear relationship comprises an arcsine function.
84. A modulator amplifier as set forth in claim 82, wherein the reference signal is one of lower- and upper- and dual-sideband modulated.
85. A modulator-amplifier as set forth in claim 84, wherein the number of steady state levels in said switching power output stage is one of 2, 3, 4, and 5.
86 A modulator-amplifier as set forth in claim 85, wherein switching occurs at one of 2, 3, and 4 times the frequency of the reference signal.
87. A modulator-amplifier as set forth in claim 82, further comprising a power supply rejection circuit configured to mitigate variations in a supply voltage.
88. A switching-mode modulator-power amplifier configured for use in parametric sound reproduction systems, comprising:
    A carrier signal generator;
    An event detector event signal generator comprising at least one comparator configured for generating event signals based upon comparison of an audio input signal and a reference signal;
    A modulator-switching mode amplifier output stage, which executes switching based upon the event signals in modulating the carrier signal, wherein there is a non-linear relationship between the events detected in the audio signal and the state changes in the output stage, the modulator-amplifier being configured for use in parametric sound reproduction systems.
89. A modulator-amplifier as set forth in claim 88, wherein said non-linear relationship comprises an arcsine function.
90. A modulator amplifier as set forth in claim 88, wherein the reference signal is one of lower- and upper- and dual-sideband modulated.
91. A modulator-amplifier as set forth in claim 90, wherein the number of steady state levels in said switching power output stage is one of 2, 3, 4, and 5.
92. A modulator-amplifier as set forth in claim 90, wherein switching occurs at one of 2, 3, and 4 times the frequency of the reference signal.
93. A modulator-amplifier as set forth in claim 88, further comprising a power supply rejection circuit configured to mitigate variations in a supply voltage.
94. A modulator-amplifier, comprising:
    A carrier signal generator;
    An event detector configured to generate a state change signal based upon detected events in an audio input signal, said event detector comparing the input signal to a reference signal;
    A modulator-switching power output stage configured for modulating a carrier for parametric sound reproduction based upon the state change signal, and wherein the timing of switching between steady state levels in said output stage is which is related to the audio input signal by a non-linear function; and,
    Wherein the switching frequency is one of 2, 3, and 4 times the carrier frequency.
95. A modulator-amplifier as set forth in claim 94, wherein the number of steady state levels is one of 2, 3, 4, and 5.
96. A modulator-amplifier as set forth in claim 95, wherein the reference signal can be suppressed and the modulator amplifier operated as a band-pass amplifier.
97. A modulator amplifier as set forth in claim 96, configured for use in a SONAR application.
98. An modulator/amplifier (ModAmp) comprising:
    a carrier reference generator for generating a carrier reference signal;
    an event generator configured for comparing an audio input signal to the carrier reference signals, and generating event trigger signals based on said comparing;
    an AM modulator configured for receiving the event trigger signals and generating double sideband modulation of the carrier signal;
    an SSB modulator configured for receiving the event trigger signals and generating SSB modulation of the carrier signal; and
    an output driver configured for receiving AM modulated or SSB modulated carrier signals and outputting a drive signal based thereon suitable for driving an ultrasonic transducer in a parametric sound reproduction system;
    wherein event trigger signals are related to the input signal by a non-linear function and modulation is switch-mode modulation based on the event trigger signals.
99. The ModAmp according to claim 98, further comprising: power supply configured for powering the ModAmp; and a power supply rejection circuit.
100. The ModAmp according to claim 98, further comprising an audio preprocessor for preprocessing the audio input to generate in-phase and quadrature audio input signals.
101. The ModAmp according to claim 100, further comprising an audio preprocessor configured to dynamically control the carrier level based upon the preprocessed audio input.
102. The ModAmp according to claim 1, wherein the ModAmp is configured for one of bi-level, tri-level, 4-level, and 5-level steady states in switching modulation/amplification.
103. The ModAmp according to claim 102, configured to perform at least one of SSB and DSB modulation.

104. The ModAmp according to claim 102, wherein the ModAmp is configured for modulation each with reduced third harmonic.
105. The ModAmp according to claim 103, wherein switching occurs at one of 2, 3, and 4 times the carrier frequency.
106. The ModAmp according to claim 103, wherein the ModAmp is configured for bi-level SSB modulation based on staggered drive.
111. A method for frequency shifting and amplifying an audio signal for use in a parametric loudspeaker system, including the steps of,
   i) receiving at least one input audio signal,
   ii) creating at least one reference signal,
   iii) comparing the at least one input audio signal with the at least one reference signal to derive at least one product signal,
   iv) combining the at least one product signal with a reference signal
   v) delivering the combination of the at least on product signal and [what?] to a switching power stage wherein at least one operation is performed selected from the following:
      a)—performing a nonlinear preprocessing to the input audio signal, and,
      b—using a non-triangle wave as the at least one reference signal
   vi) frequency shifting and amplifying the audio signal while modulating the reference signal in the switching power stage.
112. A method as set forth in claim 111, wherein there is a non-linear relationship between the audio input signal and the timing of state changes in the switching power stage.
113. A method as set forth in claim 112, wherein non-linear processing of the input audio signal is based on an arcsine function.
114. A method as set forth in claim 113, wherein the non-triangle wave is a sinusoidal wave.
115. A method as set forth in claim 111, wherein the reference signal is modulated in one of a lower sideband, and upper sideband, and both upper and lower sidebands.
116. A method as set forth in claim 111, wherein switching in the switching power stage occurs at one of 2, 3, 4, 5, and 6 times the carrier frequency.
117. A method as set forth in claim 111, wherein the step of creating at least one reference signal comprises providing a power supply rejection circuit and controlling the frequency of the reference signal to within a selected range.
118. A method as set forth in claim 111, further comprising at least one of the steps of:
   performing frequency modulation
   performing quadrature phase shift keying
   performing quadrature amplitude modulation.
1. A modulator-amplifier configured for use in parametric sound reproduction systems for reproducing audio information in a medium, comprising:
   an input configured for receiving at least one input signal including audio information;
   at least one reference signal generator configured for generating at least one reference signal;
   at least one comparator coupled to the input and the reference signal generator configured for detecting a relationship between a first signal based on the at least one input signal and the at least one reference signal and generating a second signal based thereon;
   at least one switching power stage coupled to the at least one comparator and configured to receive the second signal and drive an output signal including at least one sideband and audio information; and
   wherein the relationship between the at least one input signal and the timing of state transitions in the switching power stage is non-linear.
2. A modulator-amplifier as set forth in claim 1, wherein the medium comprises air.
3. A modulator-amplifier as set forth in claim 1, wherein the medium comprises water.
4. A modulator-amplifier as set forth in claim 1, wherein the output signal comprises two sidebands.
5. A modulator-amplifier as set forth in claim 1, wherein the output signal comprises two sidebands and satisfies at least one condition of a) the audio information being divided between the two sidebands unevenly and b) the strength of the signal is divided between the two sidebands unevenly.
6. A modulator-amplifier as set forth in claim 1, wherein the modulator-amplifier is configured for either single sideband (SSB) or double sideband (DSB) modulation.
7. A modulator-amplifier as set forth in claim 1, wherein the second signal is one of bi-level, tri-level, 4-level, and 5-level.
8. A modulator-amplifier as set forth in claim 1, wherein the at least one reference signal has a periodic waveform that is one of sinusoidal, triangle and rectiform.
9. A modulator-amplifier as set forth in claim 1, wherein the modulator-amplifier is implemented with analog electronic components.
10. A modulator-amplifier as set forth in claim 1, wherein the modulator-amplifier is implemented with at least one digital electronic component.
11. A modulator-amplifier as set forth in claim 10, wherein the at least one digital electronic component comprises a gate array.
12. A modulator-amplifier as set forth in claim 11, wherein the gate array is field-programmable.
13. A modulator-amplifier as set forth in claim 1, wherein the at least one reference signal generator further comprises a carrier level controller, whereby output power can be varied by varying the amplitude of the at least one reference signal.
14. A modulator-amplifier as set forth in claim 1, wherein output power can be varied by varying amplitude of the output signal.
15. A modulator-amplifier as set forth in claim 14, wherein the output power can be adjusted by adjusting a voltage swing between states in the at least one switching power stage.
16. A modulator-amplifier as set forth in claim 1, wherein output signal amplitude is multiplied by an integer value in the at least one switching power stage.
17. A modulator-amplifier as set forth in claim 1, further comprising a signal processor in communication with the input which venerates a level signal based on the level of the at least one input signal, wherein the at least one reference signal is amplitude modulated in accordance with the level signal.
18. A modulator-amplifier as set forth in claim 17, wherein the at least one reference signal generator modulates amplitude of the at least one reference signal based upon the at least one input signal, thereby adjusting power in the output signal.
19. A modulator-amplifier as set forth in claim 1, wherein a switching frequency of the switching power output stage is less than ten times a frequency of the at least one reference signal.

20. A modulator-amplifier as set forth in claim 19, wherein the switching frequency of the switching power output stage is less than 6 times the frequency of the at least one reference signal.

21. A modulator-amplifier as set forth in claim 1, wherein the non-linear relationship is based on an arcsine function.

22. A modulator-amplifier as set forth in claim 1, wherein the non-linear relationship is selected to minimize switching-induced distortion of audio information in the output signal.

23. A modulator-amplifier as set forth in claim 1, wherein the at least one input signal comprises a sinusoidal waveform.

24. A modulator-amplifier as set forth in claim 1, wherein the at least one input signal comprises an in-phase signal and a quadrature signal.

25. A modulator-amplifier as set forth in claim 1, further comprising a protection circuit coupled to the at least one switching power stage configured for resetting or turning off the at least one switching power stage when input power deviates from a pre-selected range of parameter values.

26. A modulator-amplifier as set forth in claim 1, wherein the modulator-amplifier is operable as one of:
a band-pass amplifier;
a part of one of an AM transmitter and SSB transmitter;
a part of a SONAR system;
a part of a diagnostic ultrasound system; and
a frequency translating amplifier.

27. A modulator-amplifier as set forth in claim 1, wherein output signal switching occurs at one of 2, 3, 4, 5 and 6 times a frequency of the at least one reference signal.

28. A modulator-amplifier as set forth in claim 1, wherein the output signal comprises at least one of an upper sideband, a lower sideband, both upper and lower sideband.

29. A modulator-amplifier, comprising:
an input configured for receiving at least one input signal including audio information;
at least one reference signal generator configured for generating at least one reference signal;
a switch mode modulator configured to modulate the at least one reference signal, configured so that there is a non-linear relationship between the at least one input signal and state transitions of a switching output waveform; and
wherein the modulator-amplifier is operable for use in a parametric sound reproduction system for reproducing audio information in a medium, the modulator-amplifier generating an output signal that has been shifted in frequency relative to a frequency of the at least one input signal, and includes at least one sideband.

30. A modulator-amplifier as set forth in claim 29, wherein the medium comprises air.

31. A modulator-amplifier as set forth in claim 29, wherein the output comprises two sidebands and satisfies at least one condition of a) the audio information being divided between the two sidebands unevenly and b) the strength of the signal is divided between the two sidebands unevenly.

32. A modulator-amplifier as set forth in claim 29, further configured to perform either SSB or DSB modulation.

33. A modulator-amplifier as set forth in claim 29, wherein the at least one reference signal is single-edge modulated.

34. A modulator-amplifier as set forth in claim 29, wherein output switching comprises one of bi-level, tri-level, 4-level, and 5-level switching.

35. A modulator-amplifier as set forth in claim 29, wherein the at least one reference signal has a periodic waveform that is one of a sinusoidal waveform and a triangle waveform.

36. A modulator-amplifier as set forth in claim 29, wherein the modulator-amplifier is implemented with at least one digital electronic component and the at least one input signal comprises pulse-code modulation.

37. A modulator-amplifier as set forth in claim 31, wherein the at least one digital electronic component comprises a field programmable gate array.

38. A modulator-amplifier as set forth in claim 29, wherein sound pressure level in the medium can be varied by varying the amplitude of the carrier signal.

39. A modulator-amplifier as set forth in claim 29, further comprising a dynamic carrier level controller in communication with the switch mode modulator.

40. A modulator-amplifier as set forth in claim 39, wherein the dynamic carrier level controller modulates amplitude of the at least one reference signal based upon the at least one input signal, whereby power is added to provide an increased sound pressure level in the medium acted on by a parametric reproduction system, and reduced to reduce sound pressure level in the medium.

41. A modulator-amplifier as set forth in claim 29, wherein a relationship between the at least one input signal and timing of state changes in a switching output stage is based on an arcsine function.

42. A modulator-amplifier as set forth in claim 41, wherein the relationship is chosen so as to minimize switching-induced distortion of audio information in the output signal.

43. A modulator-amplifier as set forth in claim 29, wherein the at least input signal comprises an in-phase signal and a quadrature signal.

44. A modulator-amplifier as set forth in claim 29, wherein the at least one reference signal frequency is proportional to a frequency of AC wall-socket power to which the modulator-amplifier is configured to be connected.

45. A modulator-amplifier as set forth in claim 29, further comprising a power supply rejection circuit employing a feed-forward amplitude/pulse-width adjustment technique for stabilizing triangle and sinusoidal reference signals.

46. A modulator-amplifier as set forth in claim 29, wherein the at least one reference signal is modulated to include audio information on one of: a) a lower sideband; b) an upper sideband; and c) both upper and lower sidebands (AM).

47. A modulator-amplifier as set forth in claim 31, wherein the modulator-amplifier is operable for one of frequency modulation, quadrature phase shift keying (QPSK) and quadrature amplitude modulation (QAM).

48. A system for generating an acoustic output reproducing an audio signal in an acoustic parametric array in an acoustic wave-transmitting medium, comprising:
a) a modulator-amplifier which produces a modulated carrier wave output which comprises a carrier waveform at an ultrasonic frequency modulated so as to include a processed audio signal, the modulated carrier wave output is operable for driving a transducer to reproduce the audio signal from the acoustic parametric array;
the modulator-amplifier including an event generator for generating a timing signal based on comparison of the audio signal and a reference signal;

the modulator-amplifier further comprising a switching output stage coupled to the event generator for signaling the switching output stage, wherein timing of switching state transitions in the output stage is related to the audio signal by a non-linear function; and b) an ultrasonic transducer coupled to the modulator-amplifier which converts the modulated carrier wave output into an ultrasonic waveform for producing an audio wave in a medium, whereby a pre-processed audio source signal is amplified and reproduced from the parametric array in the medium.

49. A system as set forth in claim 48, wherein the non-linear function comprises an arcsine function.

50. A system as set forth in claim 48, wherein the medium comprises air.

51. A system as set forth in claim 48, wherein the reference signal is one of a) a modulated upper sideband; b) a modulated lower sideband; c) a modulated double sideband (AM).

52. A system as set forth in claim 48, wherein the combined modulator/amplifier can perform amplitude modulation or sideband modulation.

53. A system as set forth in claim 48, wherein the reference signal is sinusoidal and the event generator comprises at least one comparator.

54. A system as set forth in claim 48, wherein the combined modulator/amplifier includes a digital signal processor.

55. A system as set forth in claim 54, wherein the input signal is pulse code modulated.

56. A system as set forth in claim 48, wherein the modulator/amplifier comprises a gate array.

57. A system as set forth in claim 56, wherein the gate array is field-programmable.

58. A system as set forth in claim 48, wherein the modulator/amplifier comprises a switching power output stage wherein steady-state levels is at least 2 and less than 8.

59. A system as set forth in claim 48, wherein the at least one reference signal is one of a) modulated single sideband, and b) modulated double sideband.

60. A system as set forth in claim 48, wherein the switching power output stage has a switching frequency that is one of 2, 3, 4, 5 or 6 times the reference signal frequency.

61. A system as set forth in claim 48 which can be adapted to perform one of: a) SSB; b) DSB; c) FM; d) QPSK and e) QAM modulation using the non-linear relationship of the audio signal to timing of state changes in the switching power output stage.

62. A system as set forth in claim 48, further comprising a power supply rejection circuit, coupled to the switching power output stage.

63. A system as set forth in claim 48, further comprising a dynamic carrier level controller coupled to the switching power output stage which modulates the amplitude of the reference signal based on the input signal level.

64. A system as set forth in claim 63, wherein the dynamic carrier level controller modulates the amplitude of the carrier wave based upon an incoming audio signal level, whereby power is I) added to the amplitude to provide increased sound pressure level and ii) reduced to reduce sound pressure level in the audio output in the medium based upon a sensed requirement of the source signal.

65. A system as set forth in claim 48, wherein the switching power output stage of the modamp has a switching frequency of less than ten times the carrier frequency.

66. A system as set forth in claim 48, further comprising a low-pass filter configured to remove artifacts of switching from the output signal.

67. A modulator-amplifier configured for use in parametric sound reproduction systems, comprising:
a reference signal generator for generating a reference signal;
an event detector-signal generator comprising at least one comparator configured for comparing an input signal with the reference signal and generating a timing signal based upon detected events in the input signal;
a switching power output stage configured for modulating the reference signal based upon the timing signal, whereby signal modulation is integrated with power amplification of the signal to embody a non-linear relationship between the input signal and the timing of state transitions in the modulator-output stage.

68. A modulator-amplifier as set forth in claim 67, wherein said non-linear relationship comprises an arcsine function.

69. A modulator amplifier as set forth in claim 67, wherein the reference signal is one of lower-sideband, upper-sideband or dual-sideband modulated.

70. A modulator-amplifier as set forth in claim 67, wherein the number of steady state levels in said switching power output stage is selected from the group consisting of: 2, 3, 4 or 5.

71. A modulator-amplifier as set forth in claim 70, wherein switching within the switching power output stage occurs at one of 2, 3, or 4 times the frequency of the reference signal.

72. A modulator-amplifier as set forth in claim 67, further comprising a power supply rejection circuit configured to mitigate variations in a supply voltage.

73. A modulator-amplifier, comprising:
a carrier signal generator;
an event detector configured to generate a state change signal based upon detected events in an audio input signal, said event detector comparing the input signal to a reference signal;
a modulator-switching power output stage configured for modulating a carrier for parametric sound reproduction based upon the state change signal, and wherein the timing of switching between steady state levels in said output stage is related to the audio input signal by a non-linear function; and
wherein the switching frequency is selected from the group consisting of 2, 3, and 4 times the carrier frequency.

74. A modulator-amplifier as set forth in claim 73, wherein the number of steady state levels is one of 2, 3, 4, and 5.

75. A modulator-amplifier as set forth in claim 73, wherein the reference signal can be suppressed and the modulator amplifier operated as a band-pass amplifier.

76. A modulator amplifier as set forth in claim 73, configured for use in a SONAR application.

77. An modulator/amplifier (ModAmp) comprising:
a carrier reference generator for generating a carrier reference signal;
an event generator configured for comparing an audio input signal to the carrier reference signal, and generating event trigger signals based on said comparing;
an AM modulator configured for receiving the event trigger signals and generating double sideband modulation of the carrier signal;

an SSB modulator configured for receiving the event trigger signals and generating SSB modulation of the carrier signal; and an output driver configured for receiving AM modulated or SSB modulated carrier signals and outputting a drive signal based thereon suitable for driving an ultrasonic transducer in a parametric sound reproduction system;

wherein event trigger signals are related to the audio input signal by a non-linear function and modulation is switch-mode modulation based on the event trigger signals.

78. The ModAmp according to claim 77, further comprising:
a power supply configured for powering the ModAmp; and
a power supply rejection circuit.

79. The ModAmp according to claim 77, further comprising an audio preprocessor for generating preprocessed audio input to generate in-phase and quadrature audio input signals.

80. The ModAmp according to claim 79, further comprising an audio preprocessor configured to dynamically control the carrier level based upon the preprocessed audio input.

81. The ModAmp according to claim 77, wherein the ModAmp is configured for one of bi-level, tri-level, 4-level, and 5-level steady states in switching modulation/amplification.

82. The ModAmp according to claim 77, configured to perform at least one of SSB and DSB modulation.

83. The ModAmp according to claim 77, wherein the ModAmp is configured for modulation each with reduced third harmonic.

84. The ModAmp according to claim 77, wherein switching occurs at one of 2, 3 or 4 times the carrier frequency.

85. The ModAmp according to claim 77, wherein the ModAmp is configured for bi-level SSB modulation based on staggered drive.

86. A method for frequency shifting and amplifying an audio signal for use in a parametric loudspeaker system, including the steps of,
i) receiving at least one input audio signal,
ii) creating at least one reference signal,
iii) comparing the at least one input audio signal with the at least one reference signal to derive at least one compared product signal,
iv) delivering the at least one compared product signal to a switching power stage wherein at least one operation is performed selected from the following:
a)—performing nonlinear preprocessing with respect to the input audio signal, and,
b)—creating a non-triangle wave as the at least one reference signal; and
v) frequency shifting and amplifying the input audio signal by modulating the reference signal in the switching power stage.

87. A method as set forth in claim 86, wherein there is a non-linear relationship between the audio input signal and the timing of state changes in the switching power stage.

88. A method as set forth in claim 86, wherein the non-linear processing of the audio input signal is based on an arcsine function.

89. A method as set forth in claim 86, wherein the non-triangle wave is a sinusoidal wave.

90. A method as set forth in claim 86, wherein the reference signal is modulated in one of a lower sideband, upper sideband, or both upper and lower sidebands.

91. A method as set forth in claim 86, wherein switching in the switching power stage occurs at one of 2, 3, 4, 5, and 6 times the carrier frequency.

92. A method as set forth in claim 86, wherein the step of creating at least one reference signal comprises providing a power supply rejection circuit and controlling the frequency of the reference signal to within a selected range.

93. A method as set forth in claim 86, further comprising at least one of the steps of:
performing frequency modulation;
performing quadrature phase shift keying; and
performing quadrature amplitude modulation.

94. A method as set forth in claim 86, further comprising the step of
generating multiple compared product signals based on multiple comparisons of input audio signals and reference signals; and
combining the multiple compared product signals to for a compared product signal.

95. A modulator-amplifier as set forth in claim 10, comprising an application specific integrated circuit (ASIC).

96. A modulator-amplifier as set forth in claim 1 further comprising one of a) a dynamic range compressor; and, b) a dynamic carrier level controller.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

FIG. 4 is a graphical presentation of Tri-level wave forms in one embodiment and a spectrum of the tri-level waveform in a Fourier Series Expansion;

FIG. 15 is a comparison of time and frequency domain plots for an example ModAmp system as shown in FIG. 21 in one embodiment.

FIG. 24 is a continuation of the diagram of FIG. 23.

DETAILED DESCRIPTION

Figure 1:
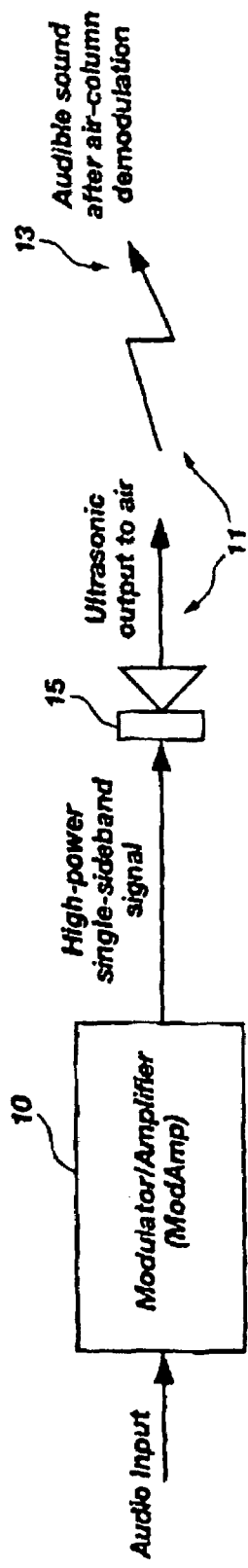
FIG. 1 is a functional block diagram in accordance with an embodiment of the invention showing an environment of the invention in a parametric sound reproduction example.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

With reference to FIG. 1, illustrating application of the ModAmp 10 in a parametric array 11. A parametric array system generates audible sound 13 in air using a transducer 15 that emits an inaudible ultrasonic frequency signal at sufficient energy. The non-linear acoustic properties of the air perform demodulation of the ultrasonic signal to generate the audible sound. In a typical parametric: array system, an ultrasonic carrier signal is modulated by audio source, then it is amplified and applied to a high-intensity speaker, emitter or transducer. The intense ultrasound causes the air in front of the emitter to exhibit a non-linear transfer characteristic. The air medium's non-linearity generates inter-modulation distortion products, in the form of sum arid difference frequencies. The audible sound is produced by the difference frequencies. For example, an upper sideband modulator with a 1 kHz input and a 40 kHz carrier frequency will produce a 40 kHz and a 41 kHz signal at the speaker 15. The non-linear air column demodulation will produce an audible 1 kHz tone in the array 11.

Parametric arrays 11 give the ability to direct or focus sound into tight beams using physically small transducers 15. The parametric array concept works both in fluids including gases such as air or in liquids such as water. The ModAmp is an ideal solution for the modulation and amplification functions required in parametric array systems because of its small size and high-efficiency.

Other applications include AM and SSB transmitters, SONAR signal modulation and amplification, medical ultrasound applications, frequency translating amplifiers, band pass amplifiers, quadrature phase shift keying and quadrature amplitude modulation in various applications.

Figure 2:
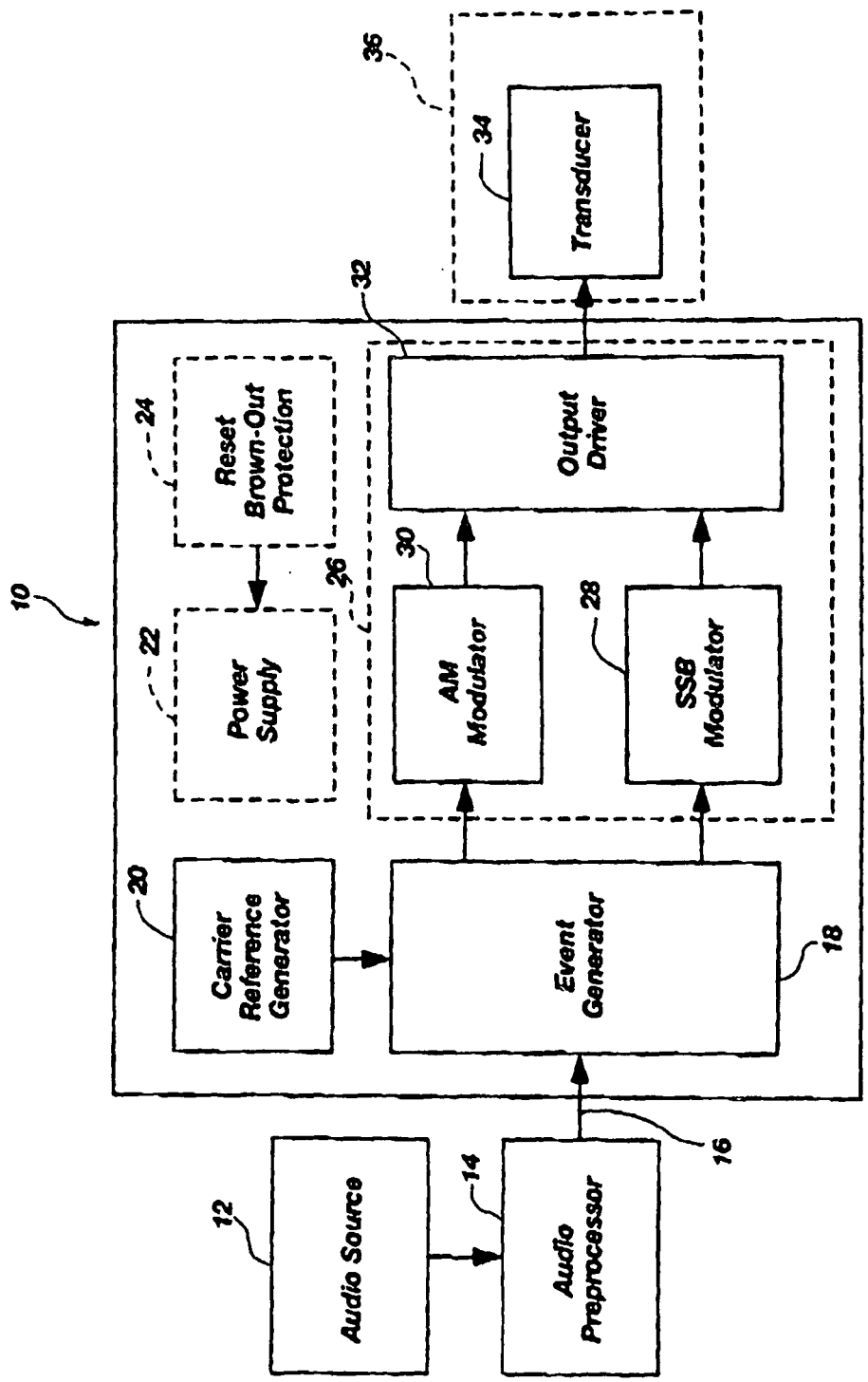
FIG. 2 is an overall functional block diagram of one embodiment of the invention.

As illustrated in FIG. 2, a modulator-amplifier system, indicated generally at 10, in accordance with the present invention, takes an audio signal from an audio source 12, which can be pre-processed in one or more ways, for example pre-distorted to correct for certain distortions inherent in parametric sound reproduction, in an audio signal preprocessor 14. The audio signal input 16 is coupled to an event generator 18. The input signal can be expressed in an in-phase (I) and quadrature (Q) sinusoidal signal. As will be appreciated the quadrature signal is a cosign (90 degrees out-of-phase) signal, based on the I signal. The input signal is compared to a carrier signal created by a reference signal generator 20 by the event generator.

It will be appreciated that a power supply 22 is provided to provide power in accordance with voltage and current parameters required by the various elements, as will be discussed below in further detail. A brown-out protection circuit 24 can be provided, as will be discussed in further detail below, where the reference signal frequency is based on a wall socket high voltage source of AC power at some frequency.

As will be further described below, timing signals or pulses are created by the event generator 18, and these and the reference signal generated by the carrier reference signal generator 20 are fed into a modulator/amplifier switching output driver stage 26. There the carrier signal is modulated according to the pulses generated by the event generator. This can be done so that the carrier is SSB modulated, by an SSB modulator portion 28 or DSB modulated, by an AM modulator portion 30. This is by state switching in an output driver 32, which all will be more fully discussed below in connection with example embodiments. The carrier signal can also be asymmetrically modulated, that is by modulating on the upper and lower sidebands by different amounts.

The carrier is switch-modulated at some multiple of carrier frequency, e.g. 2, 4 times carrier frequency; and the modulated carrier signal is fed to a transducer 34 for reproduction of the information in the audio signal form the audio source 12 in a parametric array 36 in a medium. There is a non-linear relationship between events in the audio signal from the audio source, and the occurrence of state changes in the switching in the output driver 32. This can be in accordance with an arcsine function in one embodiment. It develops that when this relationship is used certain problems are elegantly solved, and distortion is minimized and a lower multiple of carrier frequency can be used in output switching. Also, in the output stage, 2 state, 3-, 5- etc. state switching can be used, for different example implementations which will be discussed.

The non-linear relationship of the audio input signal and the state change timing in the switching output driver 32 is a feature not found in conventional class-D amplifiers. The advantages obtained are not unique to the application of parametric sound reproduction in the parametric array 36, but its use is unique to-date, in the parametric art at the time of application for letters patent.

Figure 3:
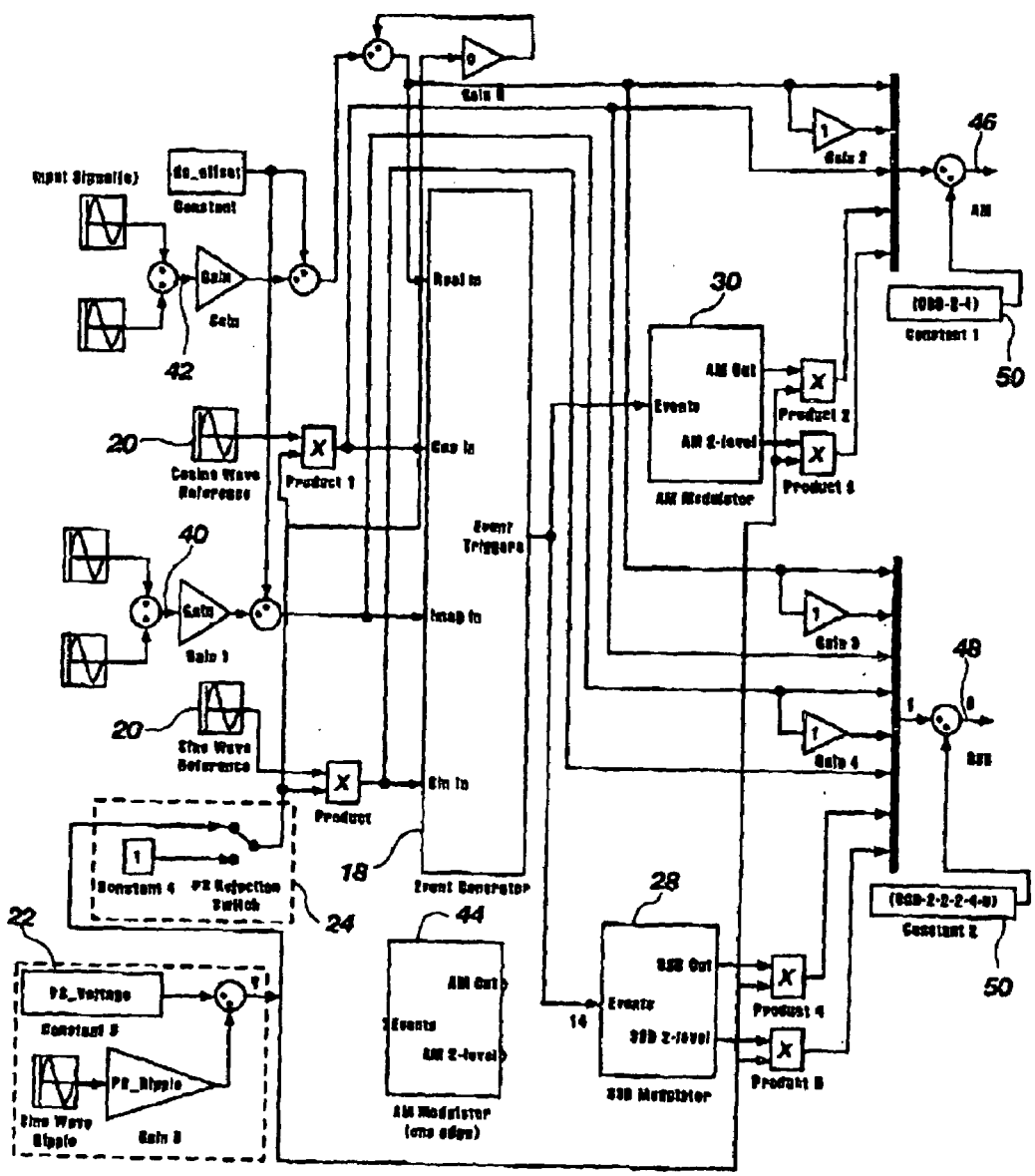
FIG. 3 is a combination top-level functional block diagram and schematic diagram giving additional detail regarding the embodiment shown in FIG. 2

With reference now to FIG. 3, the modulator-amplifier 10 can be illustrated schematically in one embodiment, wherein the system block diagrams are presented for generalized ModAmp Bi-Level SSB and DSB modulator/amplifier. In the illustrated example, inputs are sinusoidal waveforms including audio information of interest. Typically pre-recorded program material is used, but live feed audio can also be the information of interest. The input signal includes and in-phase 40 and quadrature signals, as discussed further below, which are compared to reference signals and fed to the event generator 18. Pulse signals are generated based on a non-linear functional relationship between the input signals and the reference signals. The pulse signals, or event triggers are fed to one or more of the double sideband (AM) modulator or SSB modulator, or to another kind of modulator. For example a one-edge AM modulator 44, as discussed below, can be used in another embodiment. 3 and 2 level outputs from the modulators are provided in the illustrated embodiments. Switching between steady states in the output stage is based upon the event triggers comprising pulse signals from the event generator. As mentioned, comparators are provided to compare input signals to reference signals and generate the pulses used to initiate the state changes. Depending on whether the switch-mode is bi-level or tri level a reference signal from the reference signal generator 20 powered by the power supply 22 is modulated low-high or low-zero-high to produce a modulated carrier signal at an ultrasonic frequency at an AM output 46 or SSB output 48. A constant 50 can be added to the amplitude to better match an ultrasonic transducer in a parametric array (not shown).

Using this scheme, an input signal 16 can be used to modulate a carrier with a variety of schemes such as amplitude modulation (AM) or single sideband modulation (SSB). The modulator generates an output with a small number of discrete output amplitudes (or voltage levels). Typically 2 or 3 discrete output levels are used. The modulator output can be amplified to any arbitrary level by increasing the voltage swing. In its simplest form, the modulator output is a binary signal that is either low or high. This binary signal can be applied to MOSFET switches to increase the voltage swing thereby increasing or amplifying the signal. By using this switching technique, high-efficiency power modulator/amplifiers may be realized. The combined modulator/amplifier is referred to as a ModAmp in this white paper. The ModAmp output spectrum consists of the desired modulated signal plus high frequency switching products. In typical applications, a lowpass filter is used to remove the high frequency switching products. It is not necessary to have a carrier tone present in the modulator output. The AM or SSB signal may have a carrier present or may be operated in a suppressed carrier fashion. When the carrier is suppressed, the SSB ModAmp performs frequency translation and amplification. That is, the input signal is frequency shifted and amplified by the ModAmp.

With reference to FIG. 4, bi-directional pulse waveforms with progressively wider pulse widths give progressively stronger fundamental to amplitudes, $a_1$ as given by equation (7) set forth below. The spectrum of a tri-level waveform consists of the fundamental and odd harmonics. By varying the positive and negative pulse widths of the tri-level signal as shown in the Figure, we can change the intensity of the fundamental tone, $a_1$. Pulse width modulation of this tri-level waveform is an effective way to perform AM modulation at the carrier frequency. But first, we must understand how the fundamental tone amplitude varies with pulse width. The amplitude of the fundamental and harmonic tones are derived below in the following examples. It is shown that the tri-level waveforms generate the fundamental and only odd harmonics. This puts the first out-of-band component at three times the carrier frequency. Note that the waveform described is a tri-level waveform, however, a bi-level (binary) waveform may also be used. This is detailed in a later discussion below. These modulation techniques are easily extended to multi-level signals (e.g. 4-level, 5-level, etc.) as will be appreciated by those skilled in the art.

The fundamental amplitude of the output signal is a non-linear function of the pulse width parameter. Recall that a real periodic signal with period $T=1/f_o$ can be written in terms of it's Fourier Series expansion:

$$f(t) = \frac{a_0}{2} + \sum_{n=1}^{\infty} (a_n \cos n\omega_0 t + b_n \sin n\omega_0 t) \quad (1)$$

where $$a_n = \frac{2}{T} \int_{t_1}^{(t_1+T)} f(t) \cos n\omega_0 t \, dt \quad (2)$$

and $$b_n = \frac{2}{T} \int_{t_1}^{(t_1+T)} f(t) \sin n\omega_0 t \, dt \quad (3)$$

with $$\omega_0 = 2\pi f_0 = \frac{2\pi}{T}. \quad (4)$$

The Fourier coefficients, $a_n$, and $b_n$, represent the amplitudes of the cosine and sine signals, respectively, that make up the spectrum of the periodic signal f(t). For the bi-directional pulse waveforms in FIG. 4, and using (2) and (3), it can be shown that the amplitudes of the fundamental and harmonic tones are given by $$a_n = \begin{cases} V\frac{4}{\pi n}\sin(2\pi n f_0 \tau), & \text{for } n = 1, 3, 5, \ldots \text{ odd integers} \\ 0, & \text{otherwise} \end{cases} \quad (5)$$

and $$b_n = 0, \text{ for all } n \quad (6)$$

where V is the peak value of the output waveform (or the power supply voltage) as labeled in FIG. 4.

Of particular interest is how the amplitude of the fundamental, $a_1$, varies with the pulse-width control parameter $\tau$. From (5), it can be seen that the fundamental tone amplitude is given by the following non-linear function of $\tau$:

$$a_1 = V\frac{4}{\pi}\sin\left(\frac{2\pi t}{T}\right). \quad (7)$$

The fundamental amplitude has a maximum peak value of $V(4/\pi)=V\times 1.273$ when $\tau=T/4$. This corresponds to a square wave output signal. Note that the peak output level at the carrier frequency can be greater than the power supply rail, V.

Figure 5:
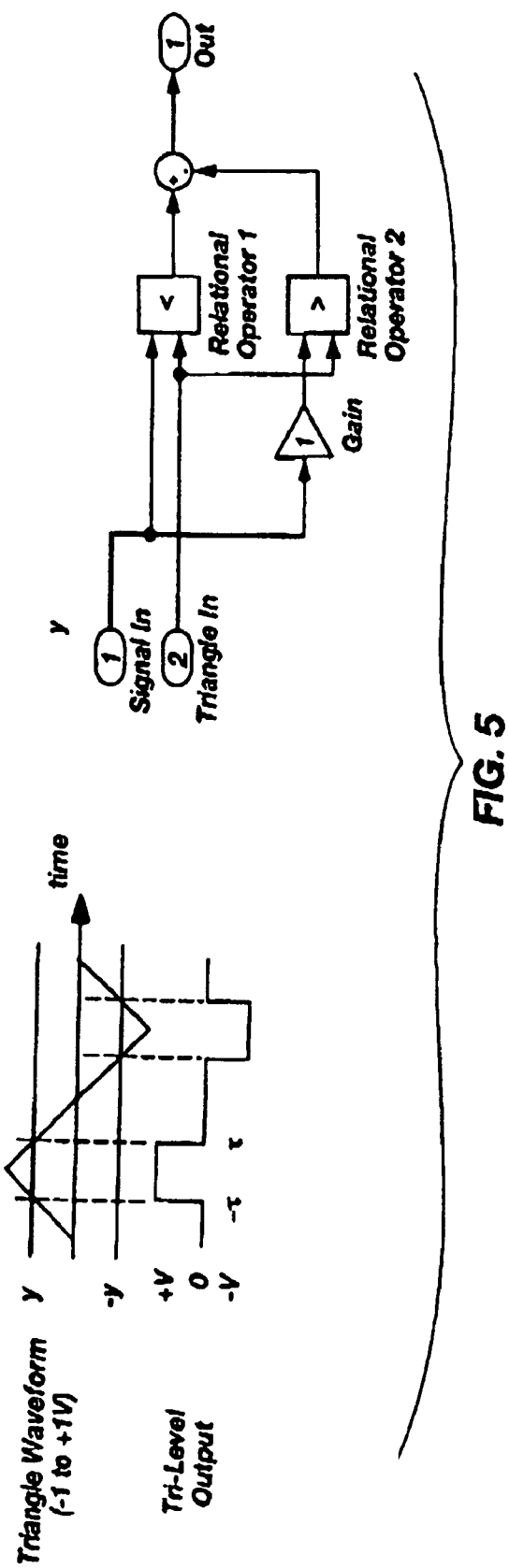
FIG. 5 is a comparison of a tri-level pulse generator shown in functional block diagram format with example waveforms.

A triangle wave and two comparators can be used to generate the tri-level waveform, as shown in FIG. 5. A triangle wave can be used to synthesize the tri-level pulse waveform. The output of the Tri-Level Pulse Generator can be directly filtered to produce a low level modulator output, or it can be amplified to deliver a high-power modulator output. From the figure, notice that as the comparator threshold variable y varies from 0 to 1, $\tau$ will vary from T/4 to 0, or $$\tau = \frac{T}{4}(1-y). \quad (8)$$

Suppose we want to perform linear AM modulation, that is, we want the output's fundamental tone amplitude to vary linearly (between 0 and it's maximum of $4/\pi$) with some input variable or signal, x. Specifically, let the amplitude of the fundamental be $$a_1 = K\frac{4}{\pi}x \quad (9)$$

where K is a constant (typically K=V). If K=V then the fundamental amplitude will vary between 0 and it's maximum of $V(4/\pi)$ as x varies from 0 to 1. By combining (7), (8), and (9) it is easy to show that the comparator threshold variable y in FIG. 5 can be written as $$\boxed{y = 1 - \frac{2}{\pi}\operatorname{asin}\left(\left(\frac{K}{V}\right)x\right)}. \quad (10)$$

Equation (10) is a necessary condition to achieve a linear variation of fundamental amplitude with the control variable, x. This equation applies when using the linear pulse width modulator of FIG. 5. Equation (10) is a necessary (but not sufficient) condition for low distortion AM and SSB modulation. Note that the spectrum given by the Fourier series expansion is only valid for a periodic signal, hence, it has been assumed the pulse width, (and 'T') has remained constant with time. Moreover, feeding the audio signal into a comparator with a triangle wave (a naturally sampled bi-pulse width generator) will cause significant distortion of the output spectra due to the non-linear relationship of pulse-width to fundamental tone amplitude. Therefore, we must linearize the system with the arcsine function. Distortion will result if we don't perform the arcsine function with this modulator example.

Figure 6:
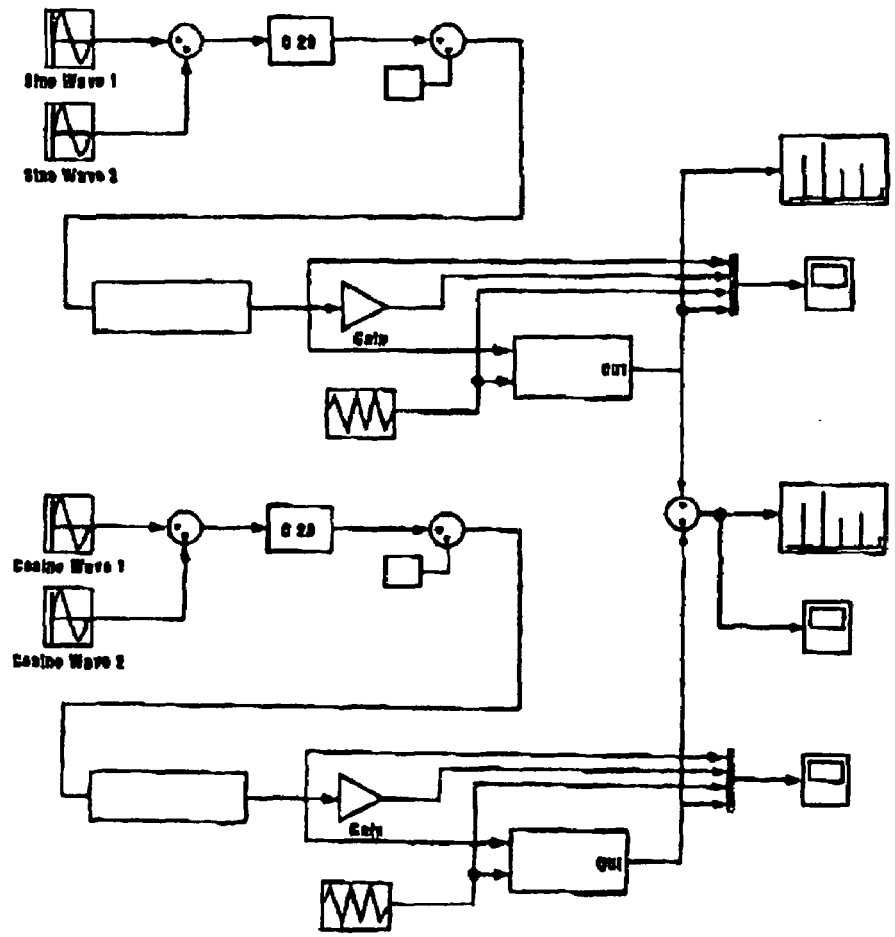
FIG. 6 is a functional block diagram illustrating a test set-up in one embodiment.

Next, rather than holding the control variable, x, at a constant, we let it change with an input signal. This achieves AM modulation of the input signal at the carrier frequency of $f_o$. FIG. 6 illustrates by a block diagram the AM and SSB modulators that use an arcsine linearizer and triangle wave comparator. The input consists of a sum of two sinusoids, one at 2,100 Hz and the other at 9,300 Hz. Next, a DC bias/offset is added to the signal, and it is passed into the AM linearizer comprising an arcsine function. A 40 kHz triangle wave is used with the tri-level pulse generator to generate the AM output.

To achieve SSB modulation, a similar signal processing path is used in the lower part of the block diagram, with the difference, being the input signal is presented in quadrature and the triangle waveform is shifted by 90 degrees. For a generalized input signal a Hilbert transform can be used to generate the required analytic signal (consisting of in-phase and quadrature components). A lower sideband output is derived by subtracting the 2 AM outputs. Upper sideband would result if we added the two AM outputs.

Figure 7:
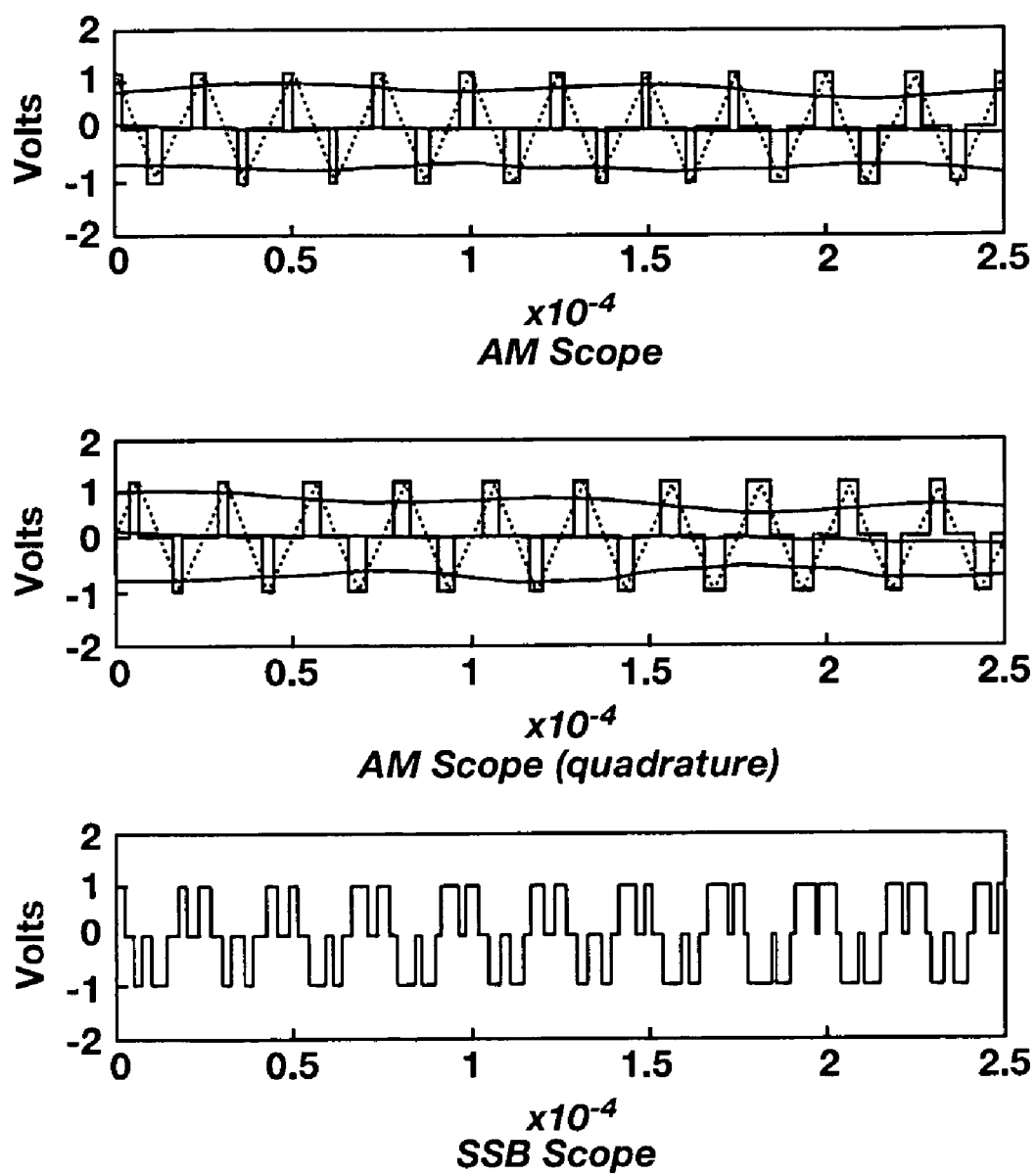
FIG. 7 is a comparison of waveforms generated by the set-up shown in FIG. 6.

The waveforms for the AM and SSB modulators are shown in FIG. 7 in time domain waveforms of a simulation output. In general, the SSB waveform can take on 5 different amplitude levels since it is the sum of two tri-level waveforms. However, if the modulator's offset constants are set appropriately and the input signal levels are limited to a certain value, then the SSB output will only take on only three levels.

Figure 8:
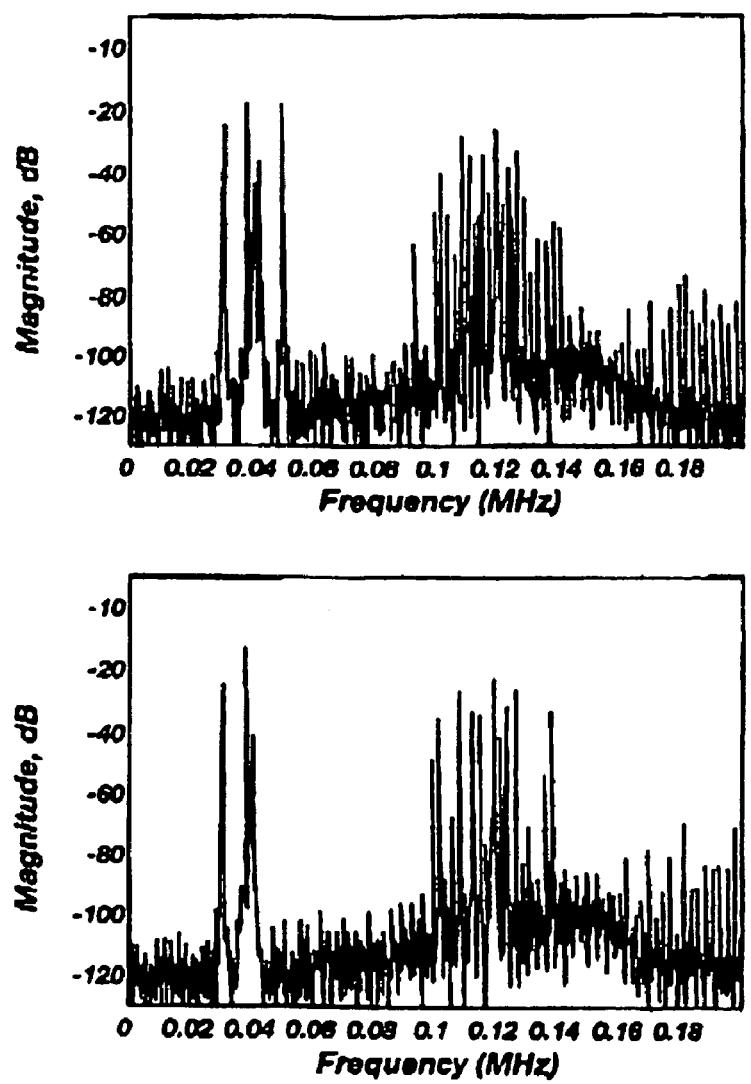
FIG. 8 is a comparison of frequency spectrum displays of AM and SSB outputs from the apparatus shown in FIG. 6.

The spectrum of the AM and SSB outputs are shown in FIG. 8. In the AM case the carrier and 40 kHz and the upper and lower side tones are clearly seen on the left portion of the spectrum. Switching products centered at three times the carrier frequency (120 KHz) are also visible. The switching products may be filtered out by a lowpass filter (not shown). The spectrum displays are generated in the simulation by passing the analog signal through 150 kHz, 8th-order Elliptic lowpass filter, sampling the analog signal at 400 kHz and taking a 8,192 point Fast Fourier Transform (FFT) with a Hanning window. Higher frequency switching products are also present but are not shown above 200 KHz. The spectrum display is only accurate out to 150 KHz because this is where the lowpass filter begins to rolloff. The filter prevents aliasing in the FFT.

To realize the power amplifier portion of the ModAmp, the switching output waveforms are increased to the desired amplitude and passed through a lowpass filter to attenuate the high frequency switching components. A power amplifier based tri-level SSB modulation can employ an H-bridge and appropriately switching the two halves of the bridge to achieve the tri-level outputs. An example ModAmp that uses this technique is detailed below.

Note that the DC bias sets the nominal carrier level. In an alternative realization as set forth below, we can operate with the carrier suppressed.

Figure 9:
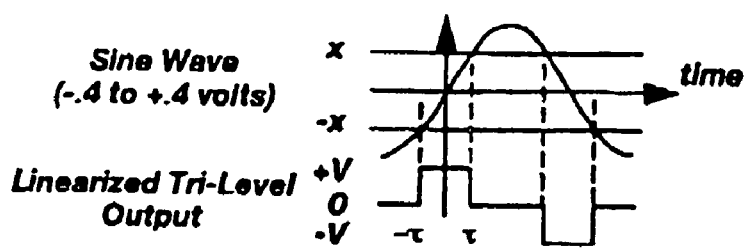
FIG. 9 is an graphical illustration of how a sine wave can be used to directly synthesize the linerarized tri-level pulse waveform and avoid having to place arc sine function hardware in the signal path.

We now take up the subject of a Sine Wave Comparator, whereas above we computed the arcsine of the input signal, x, so we could achieve linear operation when using a comparator with a triangle wave input (the linear bi-pulse width generator shown in FIG. 5). However, instead of a triangle wave, we can implicitly compute the arcsine by using a sine wave signal with a different comparator configuration. This eliminates the need for the arcsine function in the signal path. A linearized tri-level output signal can be directly synthesized by using a sine wave reference oscillator as shown in FIG. 9. In this case, a pulse is generated during the time that the absolute value of the sine wave is less than the input, x. The point at which the sine wave intersects the input value, x defines the time instant t=τ, and the following equation can be deduced from the figure, $$x = A\sin\left(\frac{2\pi}{T}\tau\right) \quad (11)$$

where A is the amplitude of the sine wave reference signal.

Solving this equation for τ and substituting it into the equation for the fundamental tone amplitude, (7); gives us a linear relationship between the input, x and the output tone amplitude:

$$a_1 = \left(\frac{V}{A}\right)\frac{4}{\pi}x. \quad (12)$$

If A is set to V/K then this equation is identical to (9). The important point here is that the fundamental amplitude is a linear function of the input or control variable, x.

Figure 10:
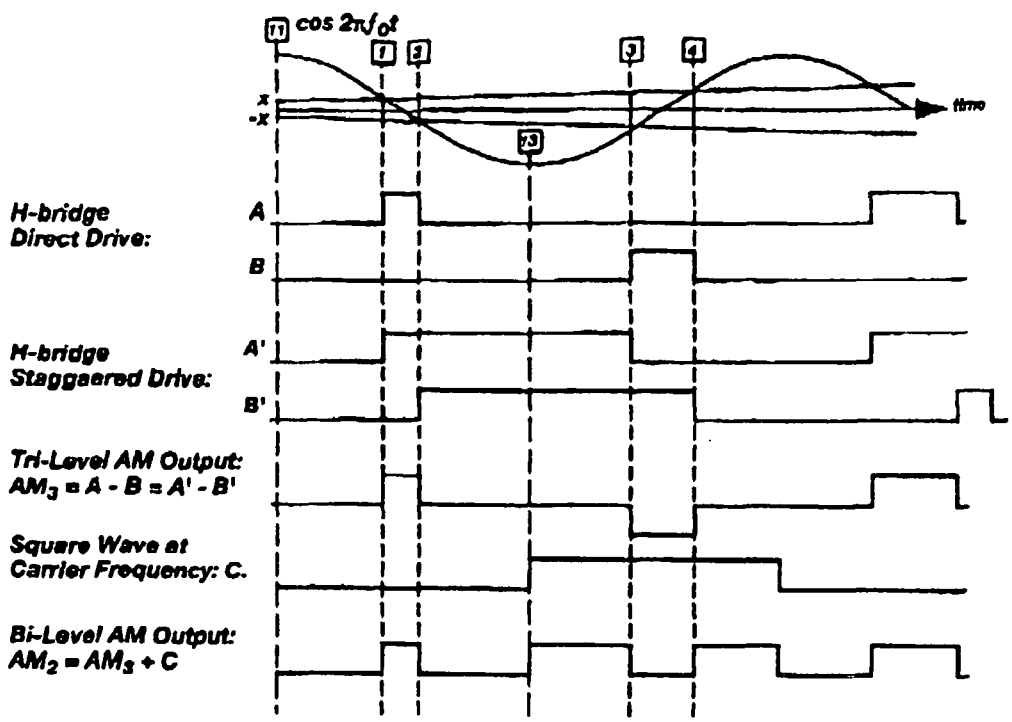
FIG. 10 is a graphical illustration of various waveforms showing sine wave synthesis of tri-level and bi-level AM in one embodiment of the invention.

With reference now to FIG. 10, Tri-Level AM and SSB with an H-bridge will now be discussed. In one embodiment we can implement tri-level AM by using an H-bridge and appropriately driving the two half bridges. FIG. 10 shows the various waveforms that may be used to generate the AM modulator output. The two halves of the H-bridge can be driven by the A and B "direct drive" signals to achieve the tri-level AM output. Alternatively, "staggered drive" may be used as shown in the A' and B' signals. All the output waveforms can be generated by triggering state transitions on the timing events as labeled in FIG. 10. For tri-level output, the DC bias must be appropriately set and input signal amplitude must be limited. If the load is placed in the center of the H-bridge, the differential gives us the desired tri-level AM output signal. The numbered boxes label the timing events that trigger the waveform transitions. The bi-level output is derived by adding a square wave at the carrier frequency.

Figure 11:
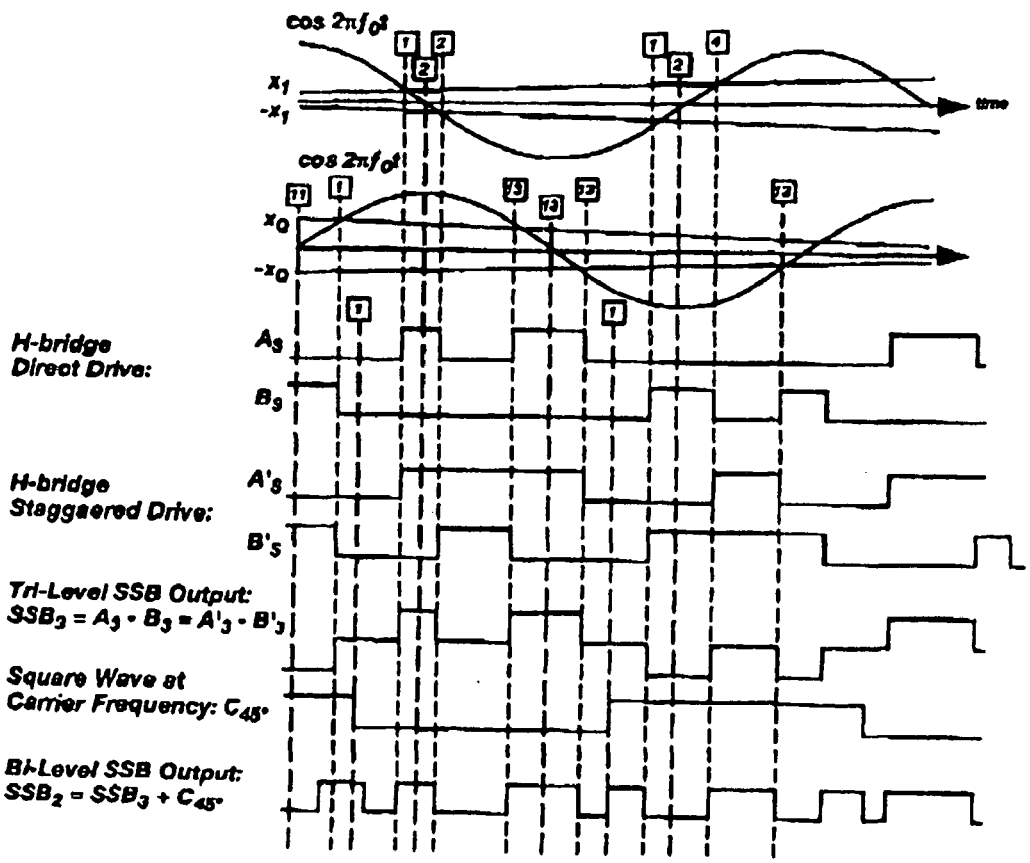
FIG. 11 is a graphical illustration of various waveforms showing sine wave synthesis of tri-level and bi-level SSB modulation in one embodiment of the invention.

Turning now to FIG. 11, the signals for single sideband (SSB) synthesis are illustrated. In this case, sine and cosine waves are compared to the input signals consisting of in-phase $X_I$ and quadrature $X_Q$ components (90 degrees out of phase from one another). The in-phase and quadrature components are typically derived by using a Hilbert transformer. Fourteen events are defined in the figure at zero crossings of the sine waves or crossings of the input signals with the sine waves. Two alternative sets of H-bridge drive signals are shown: $A_S$, $B_S$ and $A'_S$, $B'_S$. If the load is placed in the center of the H-bridge, the differential gives the desired Tri-Level SSB Output signal. Again, the numbered boxes label the timing events that trigger the waveform transitions. B bi-level output is derived by adding a square wave at the carrier frequency.

Turning again to the top-level block diagram of the modulator/amplifier of FIG. 3, in one embodiment sinusoidal input test signals are generated in quadrature and drive the real and imaginary inputs of the Event Generator block 18. The event generator derives a series of 14 short pulses, or event triggers, that are used by the AM and SSB modulators 30, 28 respectively. The event generator, AM and SSB modulators are detailed below.

Figure 12:
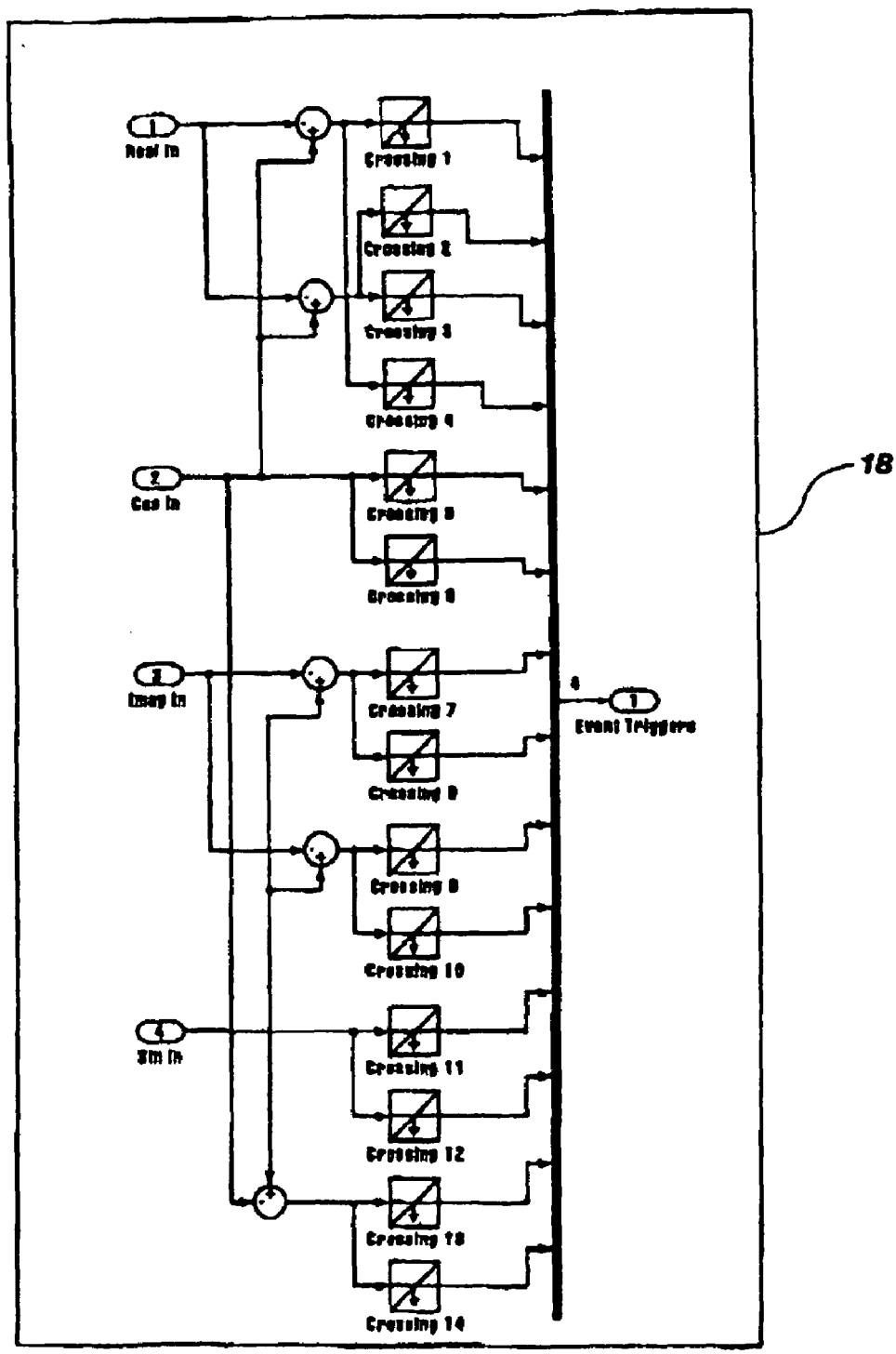
FIG. 12 is a more detailed schematic block diagram illustrating an event generator in one embodiment.

With reference to FIG. 12, each zero crossing detector outputs a short pulse when the input crosses zero in the direction shown. The event trigger signals, from top to bottom in the figure, correspond to the event numbers shown in boxes in FIGS. 10 and 11.

Figure 13:
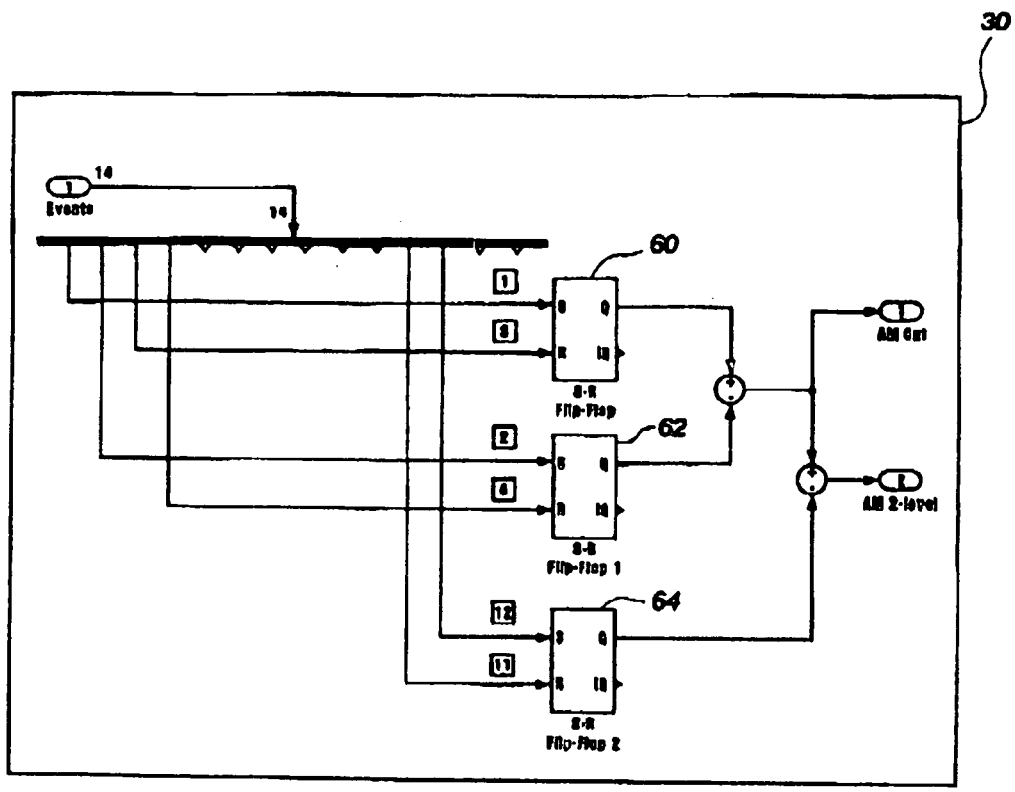
FIG. 13 is a more detailed schematic block diagram illustrating an AM modulator in one embodiment.

Turning to FIG. 13, a DSB (AM) modulator in one embodiment is shown which can be used with the ModAmp embodiment(s) set forth herein. The event triggers set and reset the flip-flops 60, 62, 64 to generate the Tri-Level and Bi-Level AM outputs, using staggered drive, as shown in FIG. 10.

Figure 14:
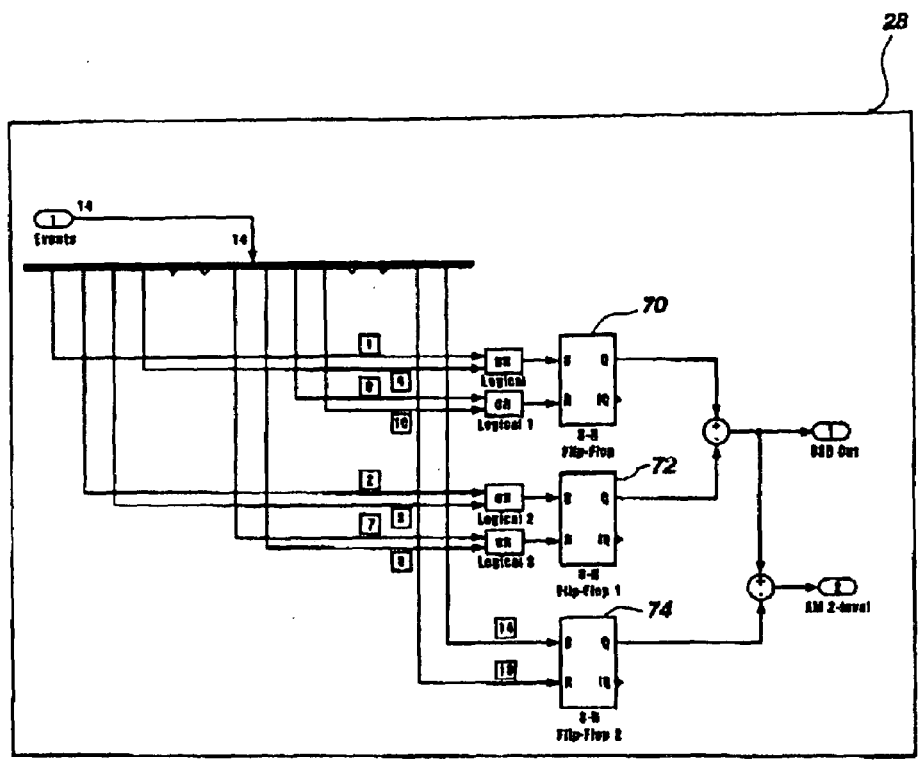
FIG. 14 is a more detailed schematic block diagram illustrating an SSB modulator in one embodiment.

With reference to FIG. 14 a SSB modulator in one embodiment is shown which can be used with the ModAmp embodiment(s) set forth herein. The event triggers set and reset the flip-flops 70, 72, 74 to generate the Tri-Level and Bi-Level AM outputs, using staggered drive, as shown in FIG. 11.

Note that it is not necessary to have a carrier tone present in the modulator output. The AM or SSB signal may have a carrier present, or may be operated in a suppressed carrier fashion. When using the staggered drive we can set the DC bias level to zero so that carrier is suppressed. In the suppressed carrier case any given pulse in the tri-level waveform can be positive going or negative going, depending on the timing order of the staggered drive edges. In the suppressed carrier case, the SSB ModAmp functions as a frequency translating 'bandpass' amplifier. That is, the ModAmp frequency translates the input spectrum to some other band of frequencies as determined by the carrier frequency.

Figure 19:
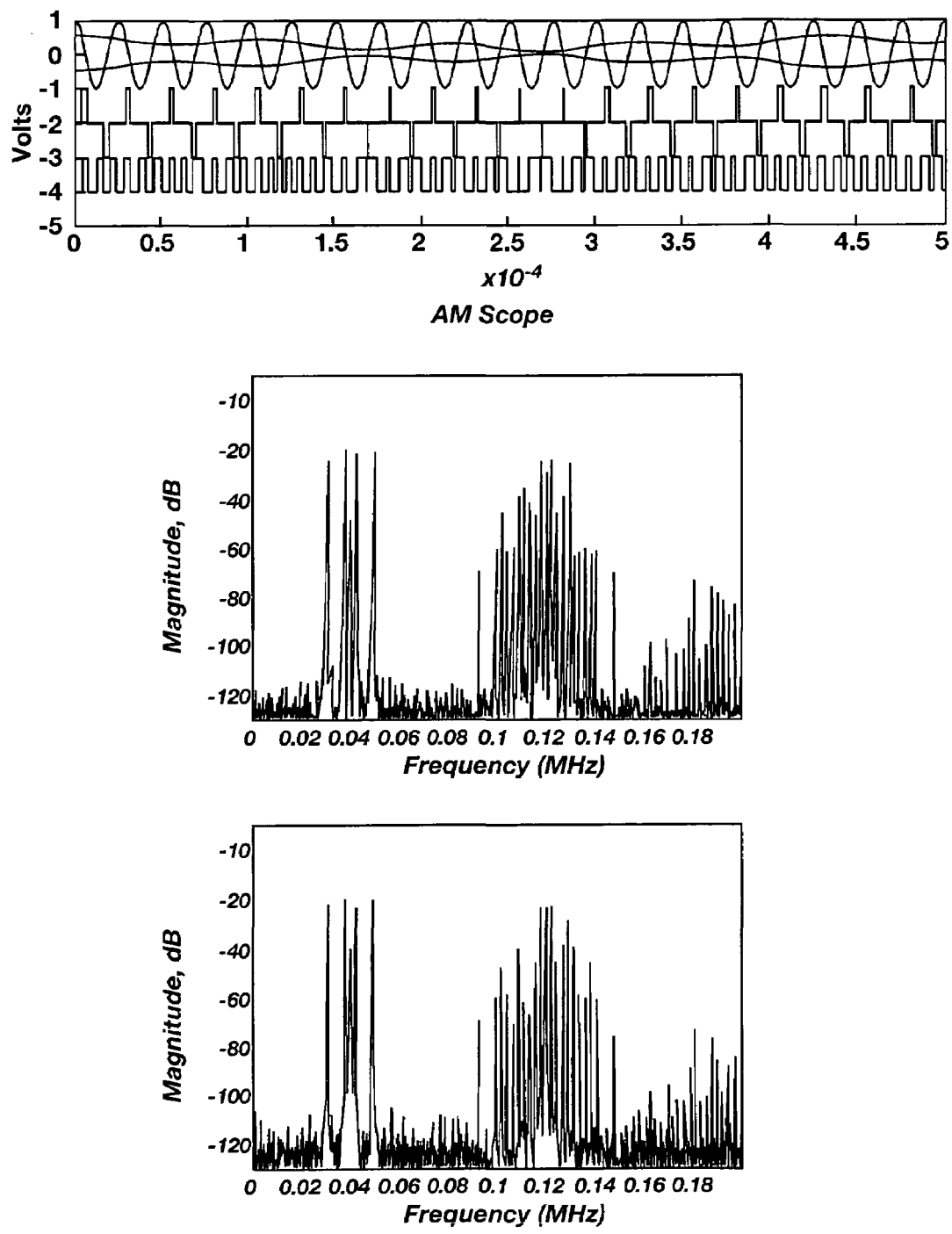
FIG. 19 is a comparison of time and frequency domain plots for an example ModAmp system as shown in FIG. 21 in one embodiment.
Figure 20:
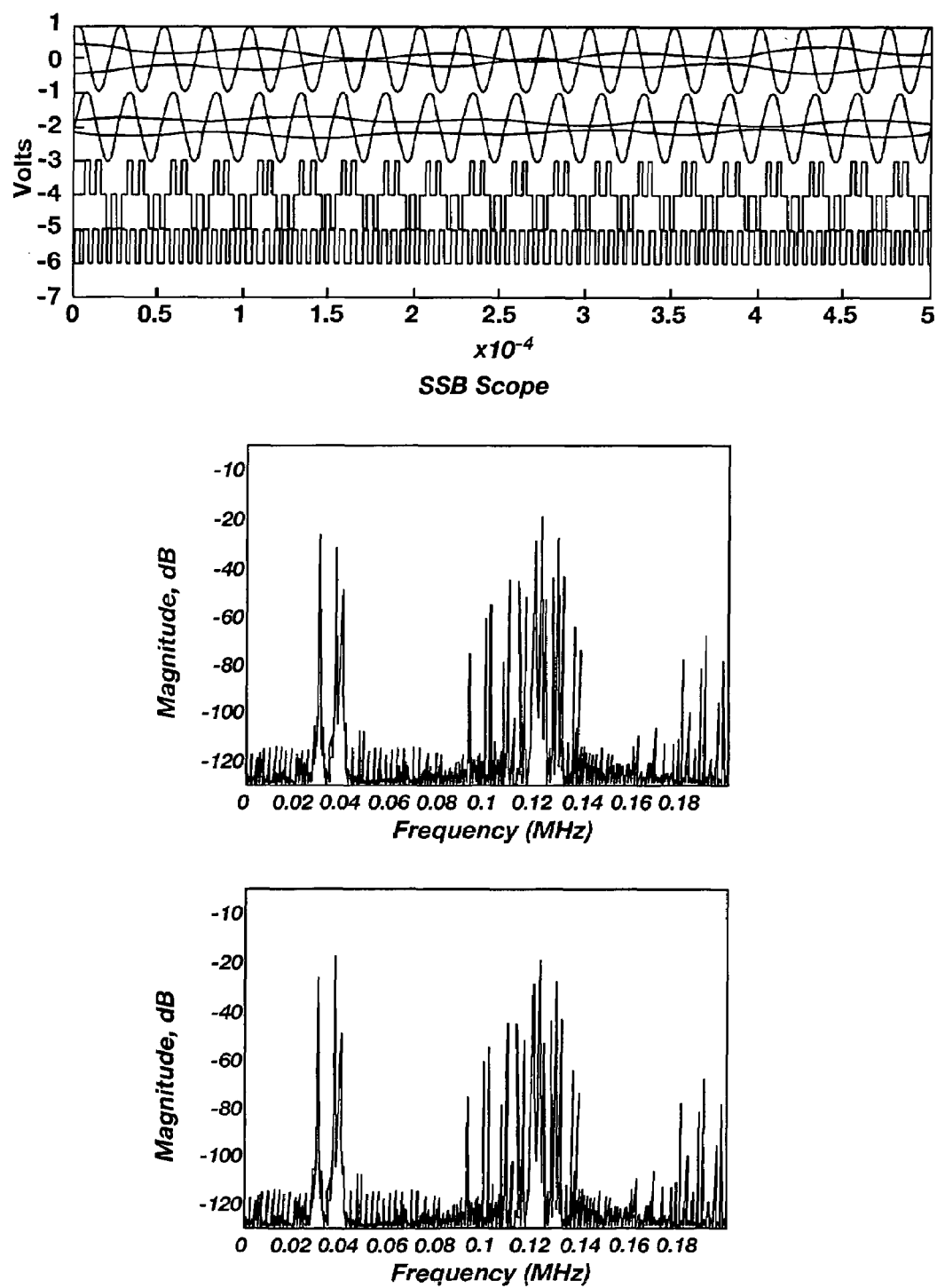
FIG. 20 is a comparison of time and frequency domain plots for an example ModAmp system as shown in FIG. 21 in one embodiment.
Figure 21:
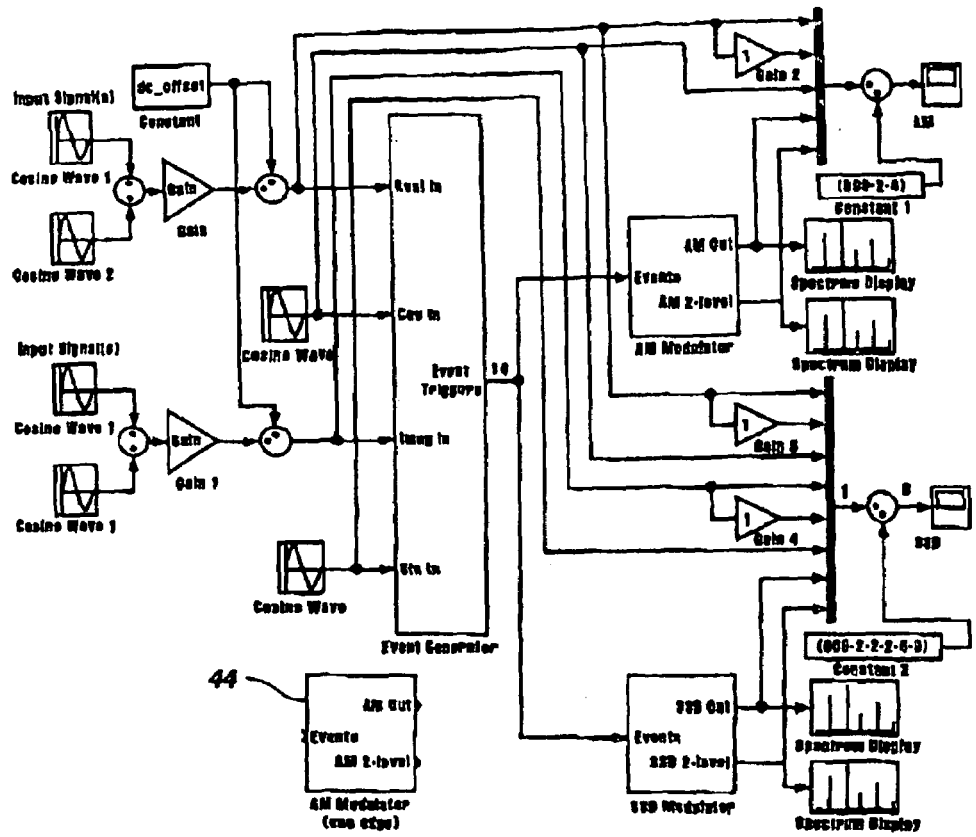
FIG. 21 is a top-level schematic block diagram illustrating an exemplary set-up of a ModAmp in one embodiment.

For true binary output in one embodiment, we want the outputs to take on only two levels. The tri-level AM and SSB waveforms can be converted to bi-level waveforms by adding a square wave at the carrier frequency, which will change the carrier level of the tri-level output. However the DC bias may be changed to allow bi-level operation with or without suppressed carrier. The bi-Level output signal allows an amplifier to be built using a half bridge (instead of a full H-bridge), requiring only two output transistors. The bi-level modulators may also be operated with suppressed carrier by properly setting the DC bias. FIGS. 15–20 show several example simulation results from a generalized ModAmp system. A test set-up used is shown in FIG. 21. The time domain and frequency domain results shown in FIGS. 15–20 were generated by the test ModAmp system illustrated in FIG. 21. In the figures time domain and frequency domain plots are shown for ease of comparison.

Figure 16:
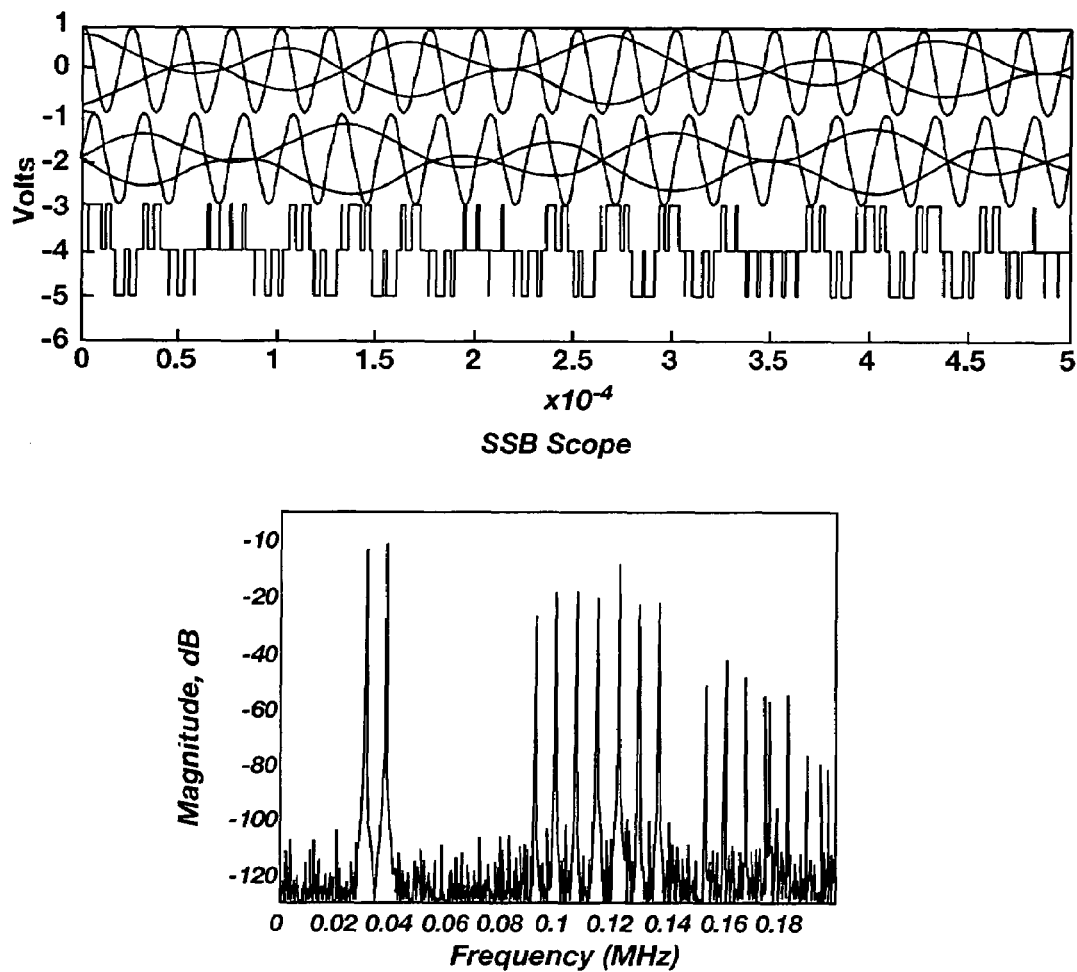
FIG. 16 is a comparison of time and frequency domain plots for an example ModAmp system as shown in FIG. 21 in one embodiment.
Figure 17:
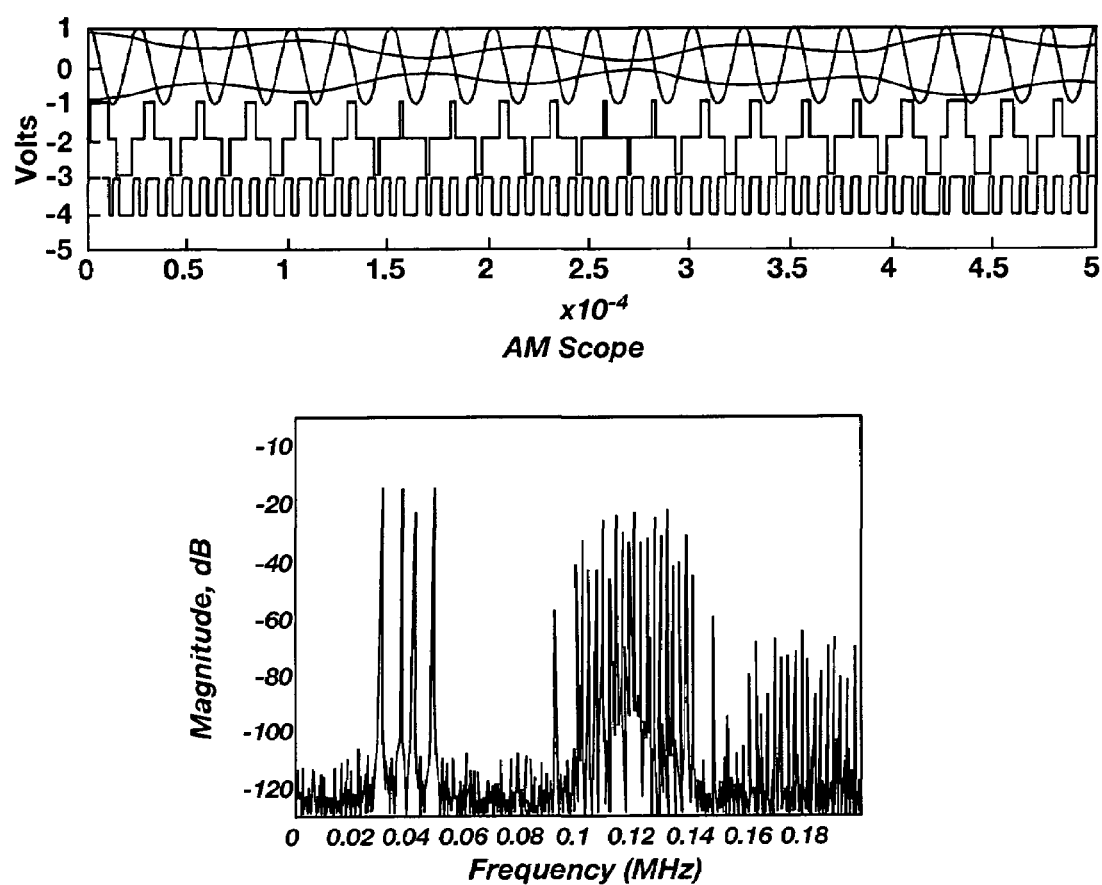
FIG. 17 is a comparison of time and frequency domain plots for an example ModAmp system as shown in FIG. 21 in one embodiment.

FIG. 15 shows Tri-level AM with suppressed carrier. Setting the DC offset constant to zero suppresses the carrier. Turning to FIG. 16, time domain and frequency domain results for Tri-level SSB modulation in the system of FIG. 21 is illustrated. Setting the DC offset constant to zero again suppresses the carrier in this lower sideband modulator example. The time domain plot show the sine and cosine reference waveforms and the in-phase and quadrature input signals. FIG. 17 shows Bi-level AM with suppressed carrier.

Figure 18:
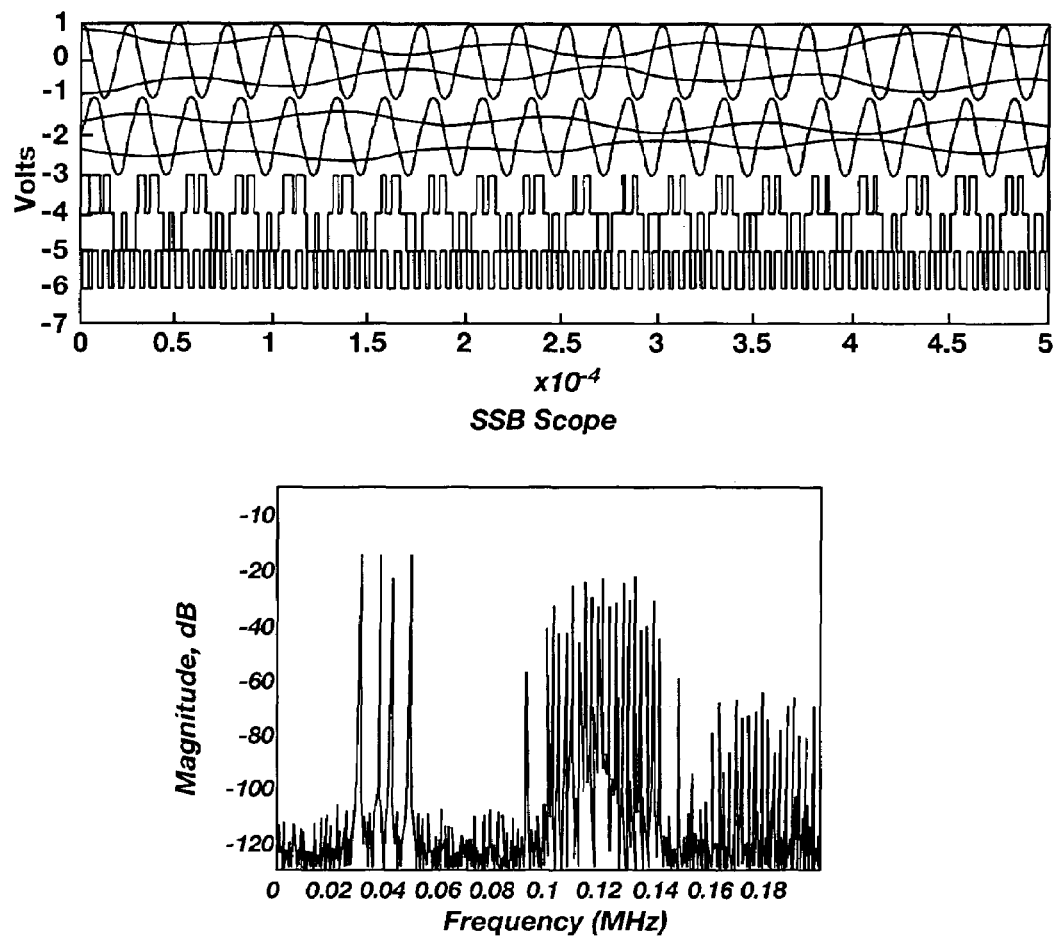
FIG. 18 is a comparison of time and frequency domain plots for an example ModAmp system as shown in FIG. 21 in one embodiment.

In this example the DC offset constant is set to 0.5 to achieve suppressed carrier in the binary waveform, which is shown in the bottom time domain waveform. FIG. 18 illustrates the Bi-Level SSB modulated case with suppressed carrier. The DC offset constant is set to 0.35353535 in the system of FIG. 21. FIG. 19 shows a comparison of the Tri-Level (top spectrum) and Bi-Level (bottom spectrum) AM modulators, with carrier. To achieve the same baseband spectrum in both cases, the DC offset constant is set to 0.255. Note that the 3rd harmonic of the carrier, at 120 kHz is larger for the Bi-Level modulator embodiment. Turning to FIG. 20, the exemplary simulation shows a comparison of the Tri-Level (top) and Bi-Level (bottom) SSB modulators with carrier. The DC offset constant is set to 0.17676767. Note that in this embodiment the 3rd harmonic of the carrier at 120 kHz is smaller rather than larger for the Bi-Level modulator. With reference to FIGS. 3 and 21, a Single Edge Modulation alternative is alluded to, and such a modulator (44 in each figure) can be provided. The tri-level AM and SSB modulator output waveforms defined above have both leading and trailing edge modulation. An alternate approach is single edge modulation. For example, we can synthesize a tri-level AM signal with a fixed leading-edge (at the zero crossing of the sine wave) and modulate the timing of only the trailing edge. This single edge modulated AM waveform may be converted to a bi-level waveform by adding a square wave at the carrier frequency. A benefit of this waveform is that it only has 2 transitions/period (instead of 6 for standard bi-level AM). A drawback of this approach is that it has spectral distortion in the modulated output signal.

With this discussion as background Table 1 summarizes the characteristics of the various modulators. We assume an H-bridge requires 4 MOSFETs and a half=bridge requires 2 MOSFETs. The "transitions per carrier period" indicate the number of signal transitions of the modulator output per carrier period. The fewer transitions generally yield higher efficiency amplifiers.

Item 5 in Table 1 below uses two bi-level AM modulators and takes the difference to synthesize the SSB output. Item 6 starts with "bi-level AM" and adds a square wave at the 3rd harmonic of the carrier. This is used to reduce the amplitude of the 3rd harmonic in the modulator output. Schemes that add higher order harmonics is also feasible. Item 7 starts with "tri-level AM" and adds a square wave at the 3rd harmonic of the carrier. Item 8 combines two "bi-level AM reduced 3rd harmonic" (item 6) to synthesize the SSB output.

The output voltage level of the ModAmp will be proportional to the power supply voltage unless we explicitly implement the feedforward technique suggested by equation (10). In the simulations, it was assumed that the power supply voltage was a constant voltage of 1. However, if we modify the ModAmp to monitor the power supply voltage, and make adjustments to the pulse widths, they will automatically compensate for power supply voltage variations and noise (such as the 120 Hz and other AC line harmonics).

Power supply rejection may be achieved by using a feedforward technique where the pulse-width is changed in response to a change in the power supply voltage. From (10) it can be seen that x is scaled by K/V before taking the arcsine. We have assumed that K=1 and V=1 in the system simulations up until now. As the power supply voltage V changes, the pulse widths can be appropriately adjusted to maintain a consistent output.

Figure 22A:
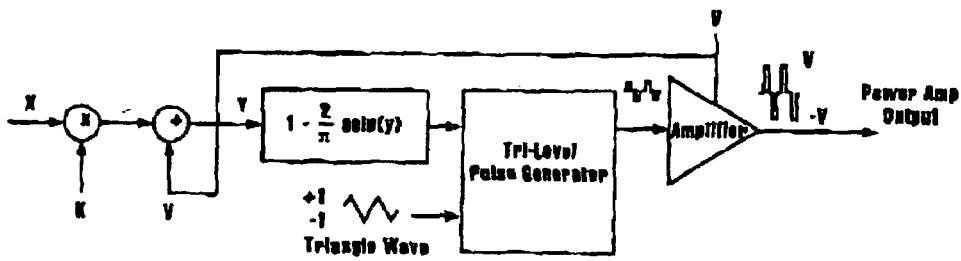
FIGS. 22(a) and (b) are schematic block diagrams of power supply rejection circuits for triangle and sine wave embodiments, respectively.
Figure 22B:
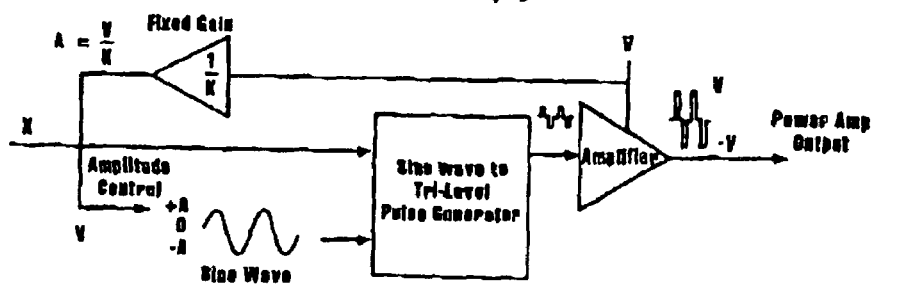

FIG. 22(*a*) shows a system with power supply rejection that explicitly implements equation (10) when using the triangle wave based tri-level pulse generator. An alternative implementation is achieved for the sine wave tri-level pulse generator case. FIG. 22(*b*) shows a system where the amplitude of the sine wave reference is varied proportionally to the power supply voltage. To see why this work, set the sine wave amplitude parameter to $$A = \frac{V}{K} \tag{13}$$

substitute it into (12). We get an output amplitude that is independent of the power supply voltage. Specifically, we get the desired linear relationship:

$$a_1 = K\frac{4}{\pi}x. \tag{14}$$

By using one of the feedforward power supply rejection techniques above, the usual requirement of a regulated power supply is eliminated.

Figure 23:
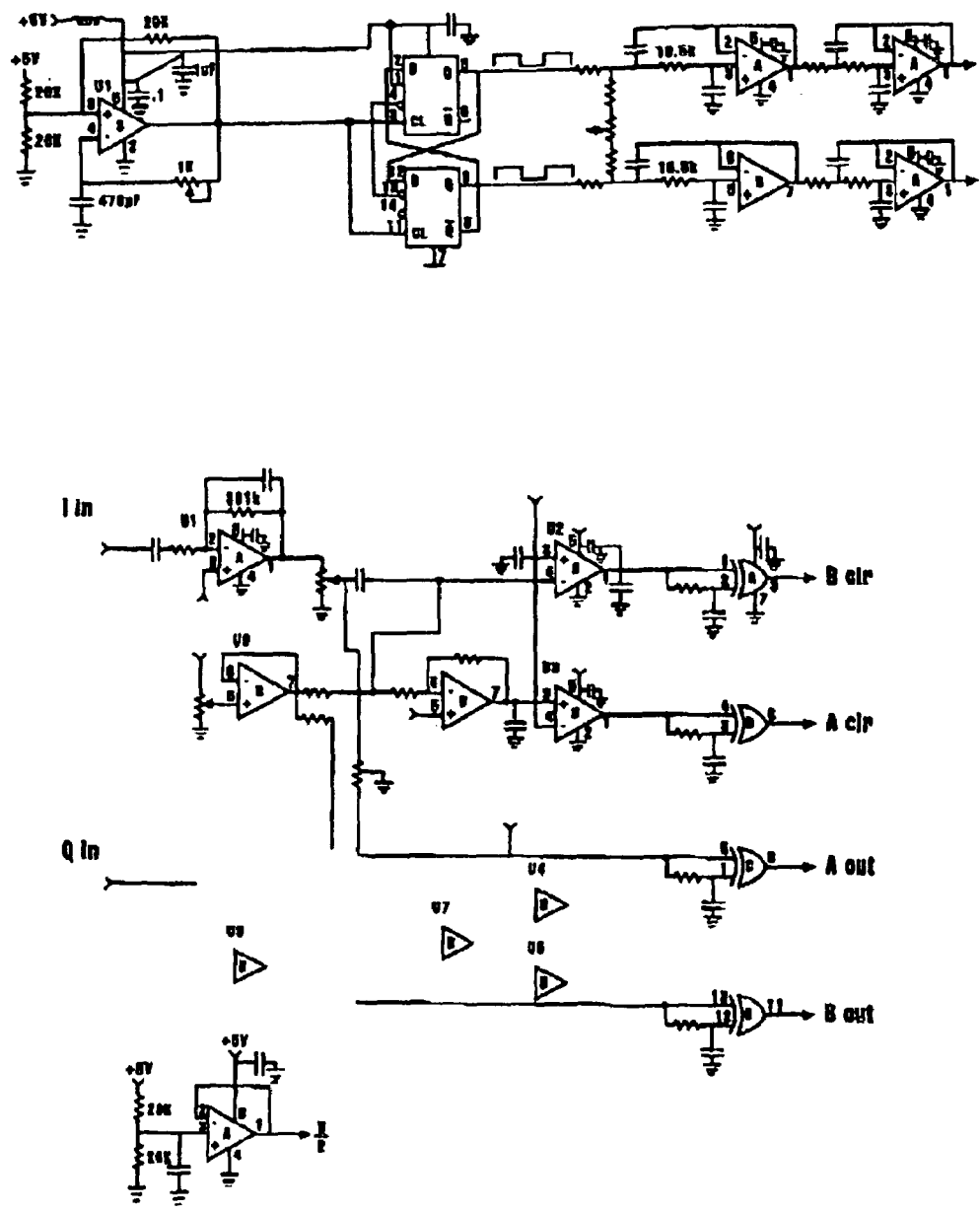
FIG. 23 is a schematic diagram of a modulator-amplifier in one embodiment.

An exemplary embodiment of the modulator-amplifier performs tri-level single sideband modulation. The schematic diagram with notes is shown in FIGS. 23 and 24. A master clock oscillator is implemented using comparator,

TABLE 1

Characteristics of the various modulators

| | Modulation Technique | # of Levels seen by load | # MOSFET switches required | transitions per carrier period | (transitions/ period) per switch pair | |
|---|---|---|---|---|---|---|
| 1 | Tri-Level AM | 3 | 4 | 4 | 2 | |
| 2 | Tri-Level SSB | 3 | 4 | 8 | 4 | |
| 3 | Bi-Level AM | 2 | 2 | 6 | 6 | |
| 4 | Bi-Level SSB | 2 | 2 | 10 | 10 | |
| 5 | SSB (Bi-Level AM × 2) | 3 | 4 | 12 | 6 | Two independent Bi-Level AM modulators |
| 6 | Tri-Level AM (reduced 3rd harmonic) | 3 | 4 | 8 | 4 | Thus is Bi-Level AM with the 3rd harmonic square wave added, |
| 7 | Bi-Level AM (reduced 3rd harmonic) | 2 | 2 | 10 | 10 | This is Tri-Level AM with the 3rd harmonic square wave added, |
| 8 | SSB (Bi Level AM reduced 3rd × 2) | 3 | 4 | 20 | 10 | |

U1. The oscillator runs at four times the carrier frequency. A simple state machine consisting of two D-flip-flops generates a pair of square waves in quadrature at the carrier frequency. Two 4th order lowpass filters are used to filter the harmonics of the square waves, leaving nearly pure sinusoidal tones. The result is the sine and cosine carrier reference signals.

The inputs to the ModAmp consists of in-phase and quadrature (Iin and Qin) audio signals. The input op-amps amplifies and hard-limits the input signals. The op-amp's output voltage is limited at the power supply rails at OV and +5V. This limiter constrains the tri-level SSB signal's maximum pulse width. After a gain trimming pot, the audio signal is AC coupled with a 1uF capacitor. Next a DC bias is added to set the carrier level. This signal is fed into the upper comparator, U2, and an inverted copy is fed into the lower comparator, U3.

The outputs of the comparators are fed to an edge detector circuit that generates a short 250 nS pulse on both the positive going and negative going comparator transitions. These "event trigger" signals are used to set and clear the A and B halves of the H-bridge.

Shown on the second page of the schematic, a complementary pair of MOSFETs are used to buffer (and invert) the event trigger pulses. The main MOSFETs are driven by a novel circuit design that use a small pulse transformer and a pair of small MOSFETs to generate the main gate drive signal. Without going into detail, the driver circuit uses the short set and clear pulses to generate bipolar gate drive signals for the main MOSFETs. The driver design avoids cross conduction (or shoot through) of the MOSFETs and operates over a wide duty cycle range.

The output load is connected between the two half bridges to extract the SSB output. In this case, a series inductor forms the lowpass filter. The high-voltage power supply for the output stage is derived by full wave rectifying the 120V AC line voltage and filtering with a capacitor. The specifications of the ModAmp prototype are shown in Table 2.

TABLE 2

ModAmp Example Specifications

Output power: 200 w
Efficiency: 95–98%
IM Distortion: 0.4% (A 1KHz input produces 39 KHz and 40 KHz
Outputs. Distortion measured over DC-60 KHz):
Note that the circuit design minimizes parts count
Input power source: 120 V AC
Physical size: ModAmp: 1.9 × 3.8 × 0.3 inch
    Power Supply and Matching Network: 1.9 × 3.8 × 1.2 inch Note that with regard to the modulator output spectrums set forth herein, closed form analytic expressions of the modulator output spectrum can be derived for all the modulation approaches discussed (assuming sine wave input).

To this point it has been assumed that the ModAmps are realized with analog components such as triangle wave oscillators, sine wave oscillators, and comparators, etc. It is feasible, however, to perform all the modulation operations in the digital do-main assuming we have a digital (pulse code modulation (PCM)) input signal.

A digital ModAmp can be realized as follows: (1) up-sample the input PCM waveform, (2) compare the upsampled input to a digitally synthesized sine wave, and (3) use the comparator outputs to generate the driver signals for MOSFET power switches. The problem can be reduced to finding the zero crossing times of the oversampled or interpolated PCM waveforms, (similar to the analog event generator of FIG. 11). To allow accurate calculation of zero crossing times without excessive sampling rates, a root finding method (such as the Newton method) may be used.

Once zero crossing times are calculated, digital PWM logic can generate the output waveforms. If high accuracy timing resolution is required on the edges, an extremely high clock rate would be required for a digital PWM. To alleviate the requirement for excessively high clock rates, techniques such as noise shaping may be applied to dither the timing of the edges (e.g. Delta Sigma modulation).

A Polyphase Variation is also possible in one embodiment. Multiple ModAmps may be paralleled to reduce the output ripple voltage can increase the power. Each amplifier would be operated at a slightly advanced phase from the previous amplifier. The outputs of the "staggered phase" ModAmps would be added together through the output filter inductor, for example. With this polyphase approach, it is also possible to increase the frequency of out-of-band components, thereby reducing the post filtering requirements.

A FM Modulator Variation is also another possible embodiment. An FM modulator version of the ModAmp may be implemented using the same elements as the AM version with the following modifications. First, set the input to the ModAmp to a constant. This gives us a constant carrier output. Second replace the oscillator (triangle wave or sine wave depending on the ModAmp) with a voltage controlled oscillator (VC)). Finally use the control input of the VCO as the modulator input.

Note that it is not necessary to use an AM linearizer (since DC is used as an input) or a sine wave oscillator. We simply need to create the tri-level or bi-level waveform that will result in a carrier tone at the fundamental frequency. The VCO performs the FM modulation, the comparators generate the switching signals, and the MOSFETs switches amplify the waveform. The result is an FM ModAmp. Furthermore, this basic principle can be extended to other modulation schemes such as quadrature phase shift keying (QPSK), quadrature amplitude modulation (QAM), etc.

Now further embodiments will be discussed, and some overlapping of the previous discussion will be included. However, additional understanding will be imparted by consideration of the following discussion.

Figure 25:
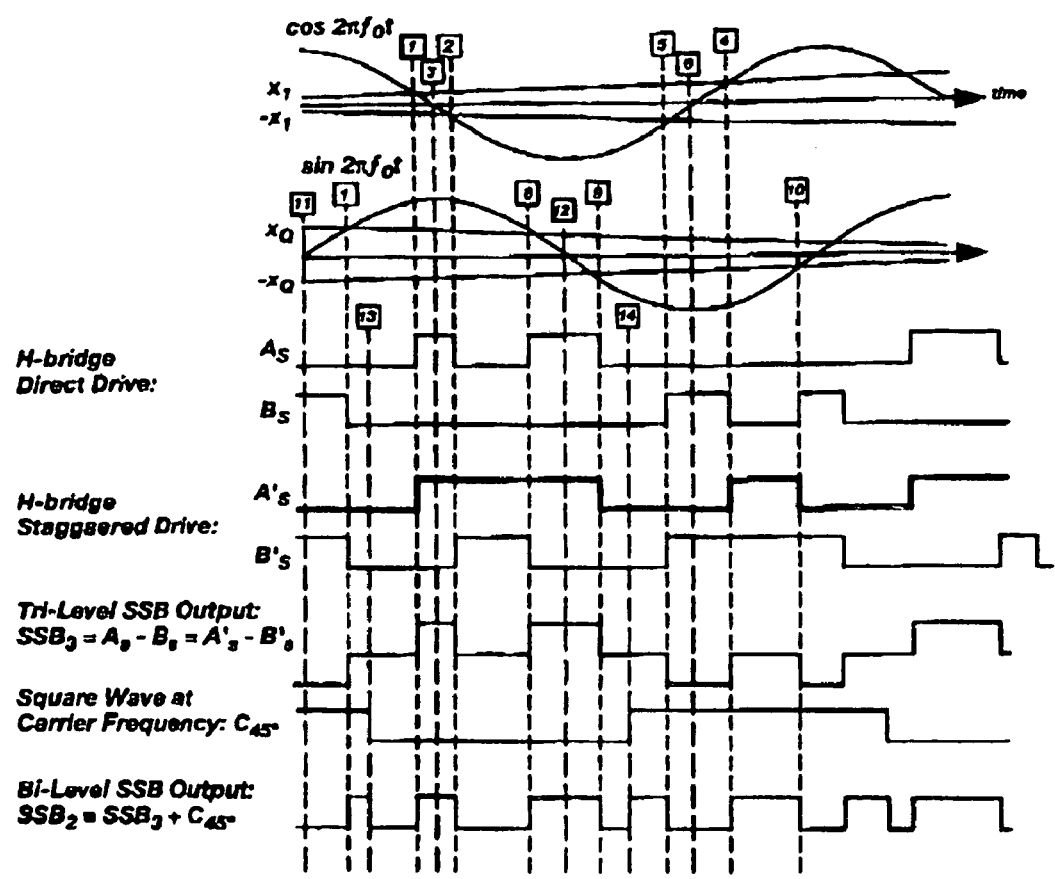
FIG. 25 is a comparison of waveforms in a ModAmp in one embodiment.

With reference to FIG. 25, signals for single sideband (SSB) synthesis. In this case, sine and cosine waves are compared to the input signals consisting of in-phase and quadrature components (90 degrees out of phase from one another). The in-phase and quadrature components are typically derived by using a Hilbert transformer. Fourteen events are defined in the figure at crossings of the input signals with the sine waves or at zero crossings of the sine waves.

Figure 26:
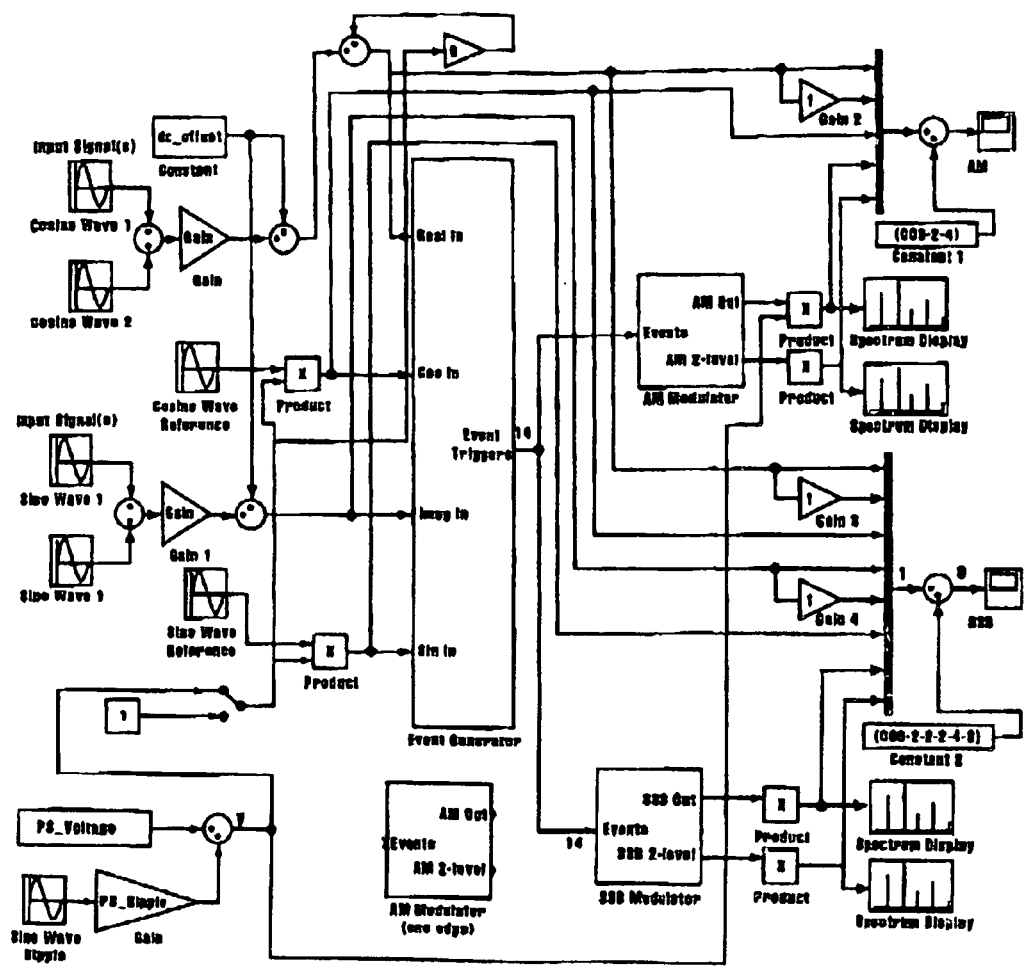
FIG. 26 is a top-level schematic block diagram illustrating an exemplary set-up of a ModAmp in one embodiment.
Figure 27:
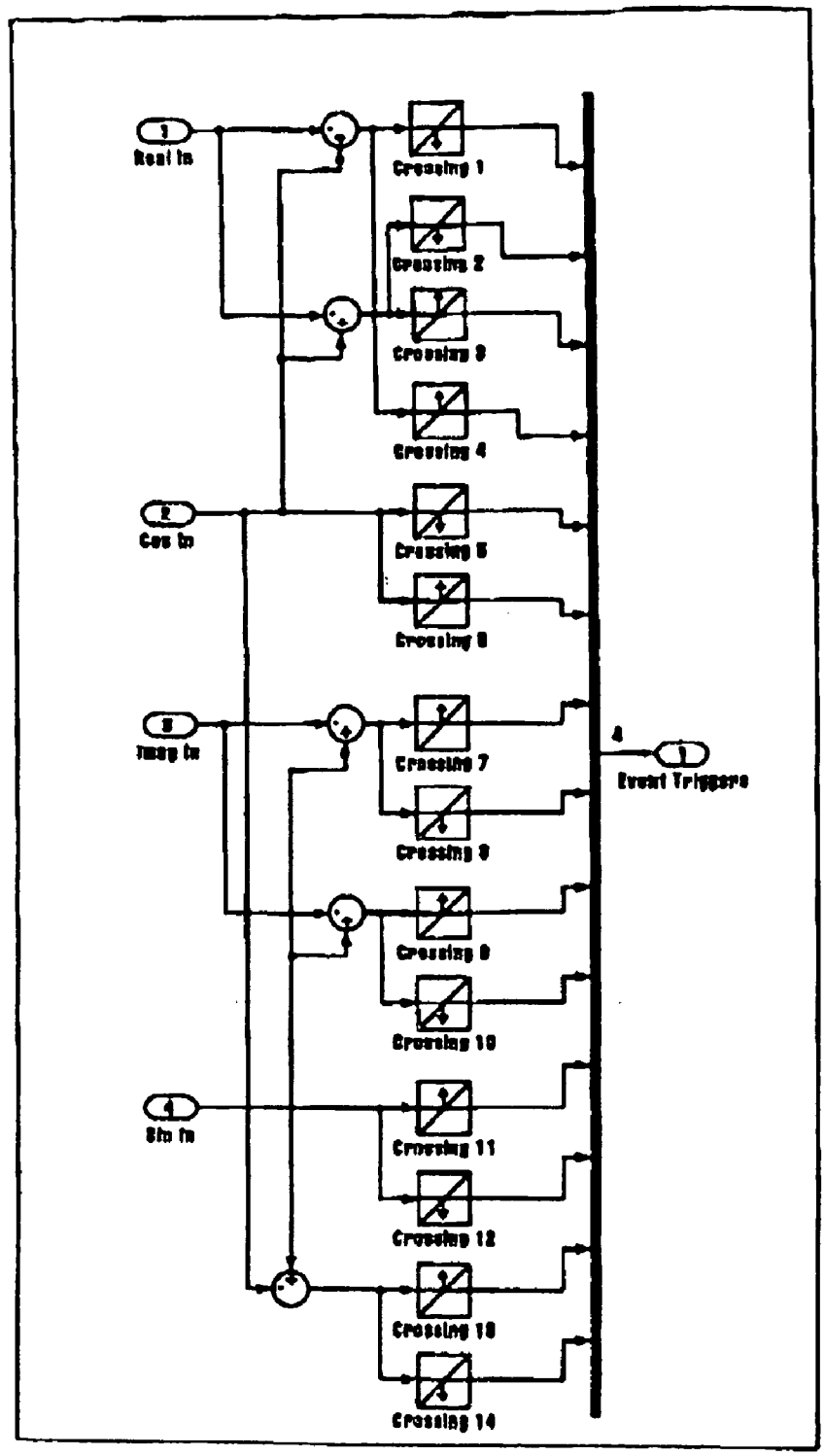
FIG. 27 is a more detailed schematic block diagram illustrating an event generator in one embodiment.
Figure 28:
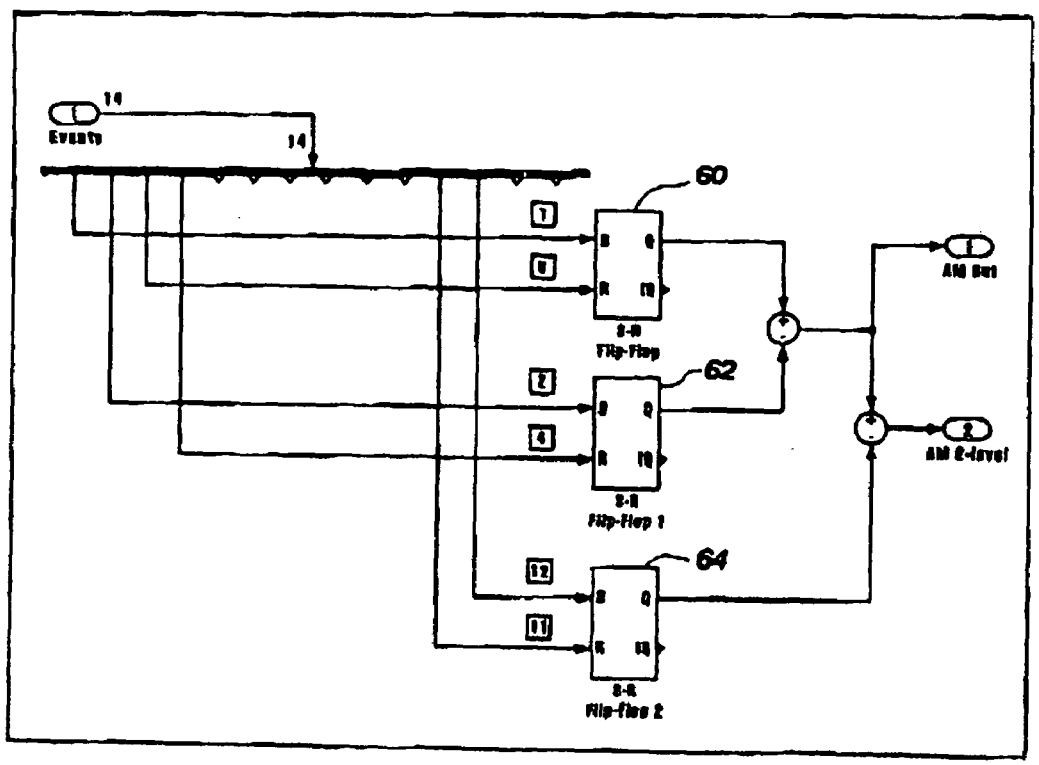
FIG. 28 is a more detailed schematic block diagram illustrating an AM modulator in one embodiment.
Figure 29:
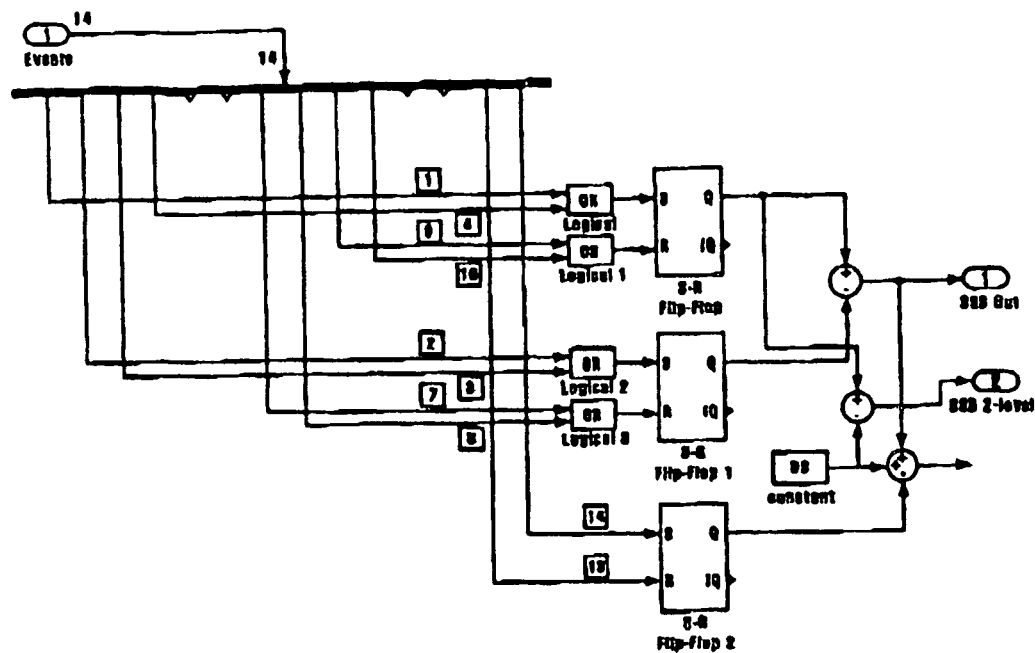
FIG. 29 is a more detailed schematic block diagram illustrating an SSB modulator in one embodiment.

FIG. 26 shows the top-level block diagram of the modulator/amplifier in another embodiment. Sinusoidal input test signals are generated in quadrature and drive the real and imaginary inputs of the Event Generator block, detailed in FIG. 27. The event generator derives a series of 14 short pulses, or event triggers, that are used by the AM and SSB modulators. The AM and SSB modulators are detailed in FIG. 28 and FIG. 29, respectively.

For binary output, we want the outputs to take on only two levels. The tri-level AM and SSB waveforms can be converted to bi-level waveforms by adding a square wave at the carrier frequency, as shown at the bottom of FIG. 25. Alternatively, the bi-Level signal labeled as $A'_S$ (the bold waveform) in FIG. 1 yields the desired SSB output. The bi-Level output signal allows an amplifier to be built using a half bridge (instead of a full H-bridge) requiring only two output transistors.

Figure 30:
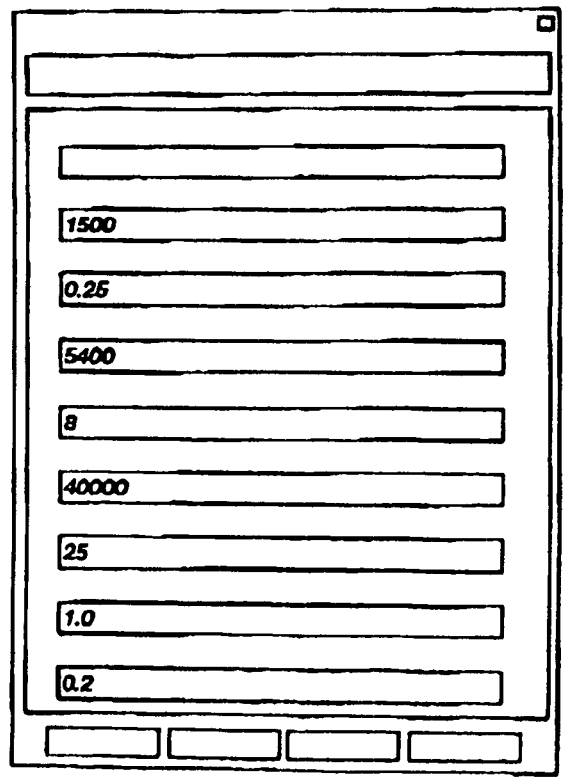
FIG. 30 is a screen shot of settings for a simulation in accordance with one embodiment.
Figure 31:
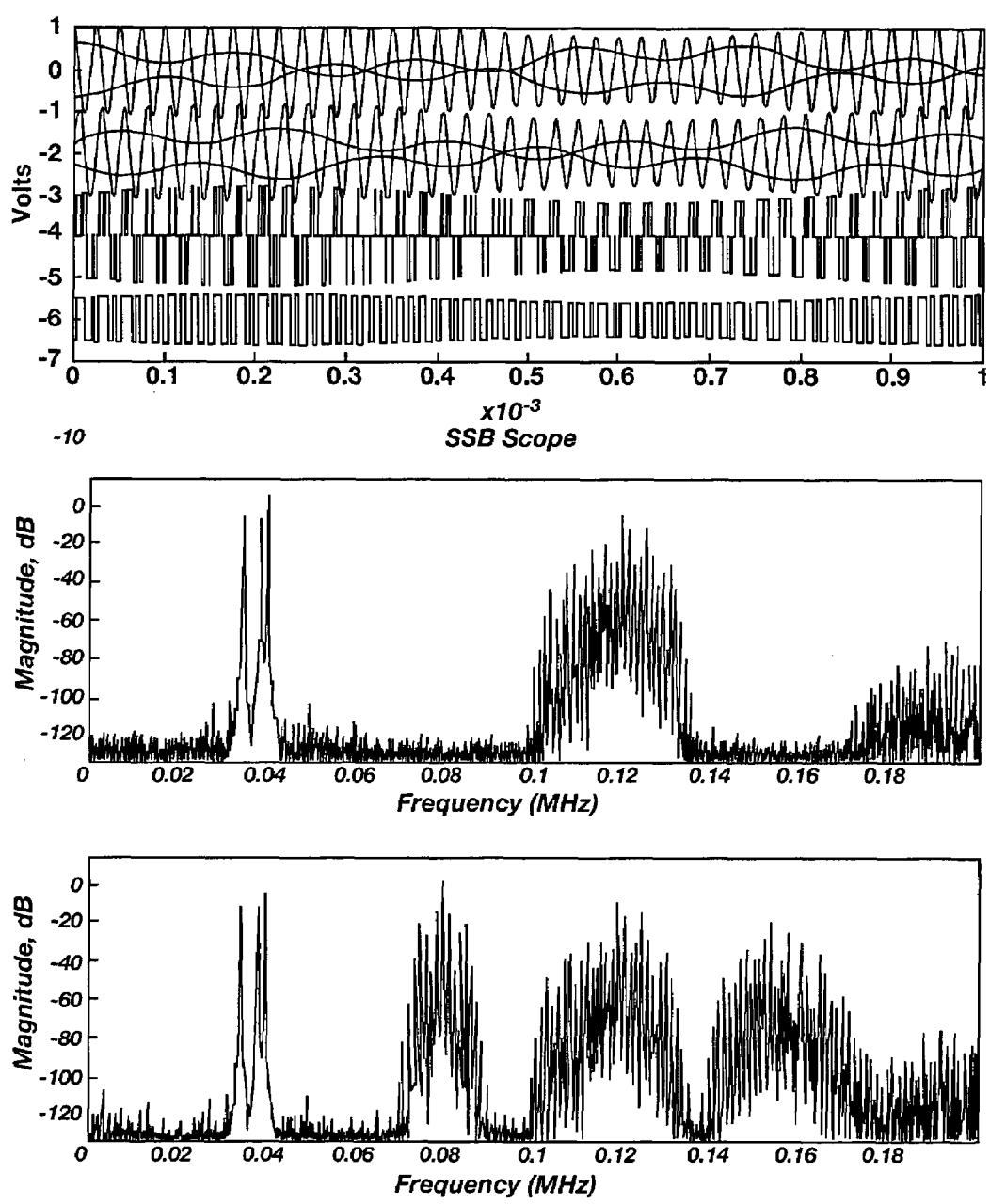
FIG. 31 is a comparison of time and frequency domain plots for an example ModAmp system as shown in FIG. 21 in one embodiment.

A simulation was run with two test tones using the parameter settings shown in FIG. 30. The top of FIG. 31 shows the time domain waveforms for tri-level and $A'_S$-bi-Level modulation. The remainder of FIG. 31 shows the spectrum for the two cases. Notice that the $A'_S$-bi-Level modulation has out-of-band signals centered around 80 KHz. Since the PVDF transducers used in our application have negligible output above 55 KHz, we use the simple $A'_S$-bi-Level modulation scheme in the Analog ModAmp.

Figure 32:
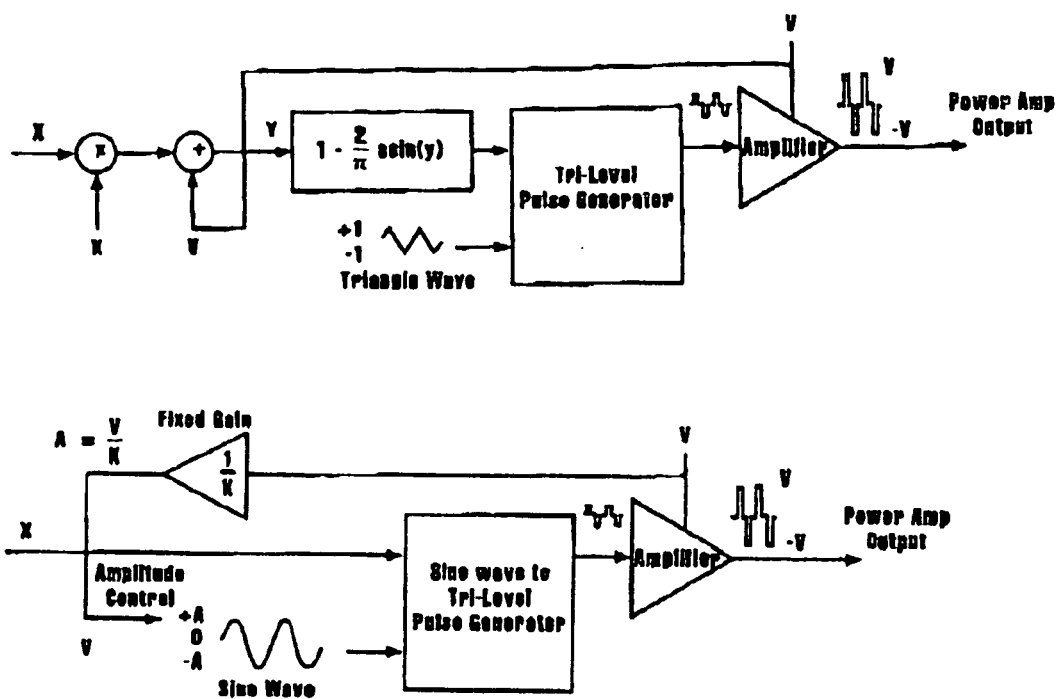
FIG. 32 is schematic block diagram of power supply rejection circuits for triangle and sine wave embodiments, respectively.

The power supply noise/ripple rejection approach of FIG. 32 is used in the Analog ModAmp. It was shown in the invention disclosure document that if the reference oscillators' amplitudes are controlled in proportion to the MOSFET power supply voltage, then we achieve an output that is independent of the supply voltage.

Table 3 summarizes the characteristics of the various modulators. We assume an H-bridge requires 4 MOSFETs and a half-bridge requires 2 MOSFETs. The "transitions per carrier period" indicate the number of signal transitions of the modulator output per carrier period. The fewer transitions generally yield higher efficiency amplifiers. Item 5 uses two bi-level AM modulators and takes the difference to synthesize the SSB output. Item 6 starts with "bi-level AM" and adds a square wave at the 3rd harmonic of the carrier. This is used to reduce the amplitude of the 3rd harmonic in the modulator output. Schemes that add higher order harmonics is also feasible. Item 7 starts with "tri-level AM" and adds a square wave at the 3rd harmonic of the carrier. Item 8 combines two "bi-level AM reduced 3rd harmonic" (item 6) to synthesize the SSB output. Item 9 is the new technique used in the Analog ModAmp described in this document.

MP3 player must be used that preserves the DC term. The Samsung YP-30S was selected for this application. The Analog ModAmp was designed and built that performs bi-level lower-sideband modulation. The circuits are described in the following paragraphs.

Figure 36:
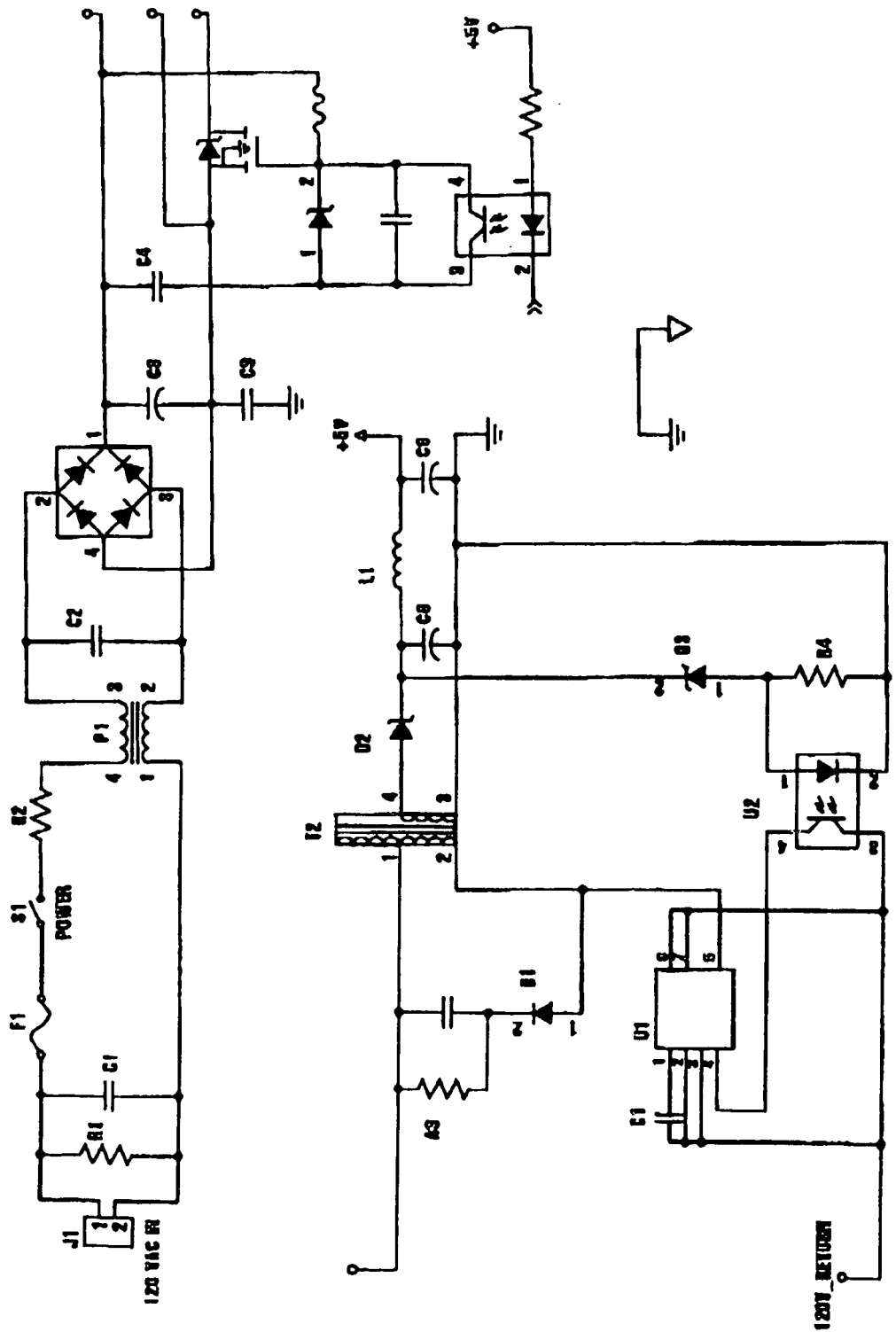
FIG. 36 is a schematic diagram of a modulator-amplifier in one embodiment.

The power supplies are shown in the schematic in FIG. 36. The high voltage power supply is a simple off-line supply consisting of EMI filter components, a full wave bridge rectifier and filter capacitors. This high voltage supply powers the main MOSFETs and the auxiliary power supply. The auxiliary supply produces 5V for the ModAmp's control circuitry and the MP3 player. It is based on the Power Integrations TNY264 fly-back regulator chip. This chip packs all the control logic and the main switch for the complete transformer isolated fly-back power supply.

Sine/Cosine Reference Oscillators are implemented as follows: the master clock oscillator is the LTC 1799 chip, U5, in FIG. 37. The inductor L7 ensures that oscillator noise is not conducted into the 5V supply. The oscillator runs at four times the carrier frequency. A simple state machine consisting of two D-flip-flops, U6, generates a pair of square waves in quadrature at the carrier frequency. Two 4th order Chebyshev lowpass filters consisting of U7, U8 and associated R's and C's, are used to filter the harmonics of the square waves, leaving nearly pure sinusoidal tones. The result is the sine and cosine carrier reference signals. DC blocking capacitors C17 and C25 decoupled the accumulated offset error in the filter. A final gain stage, U9, is used to boost the signal level.

Figure 37:
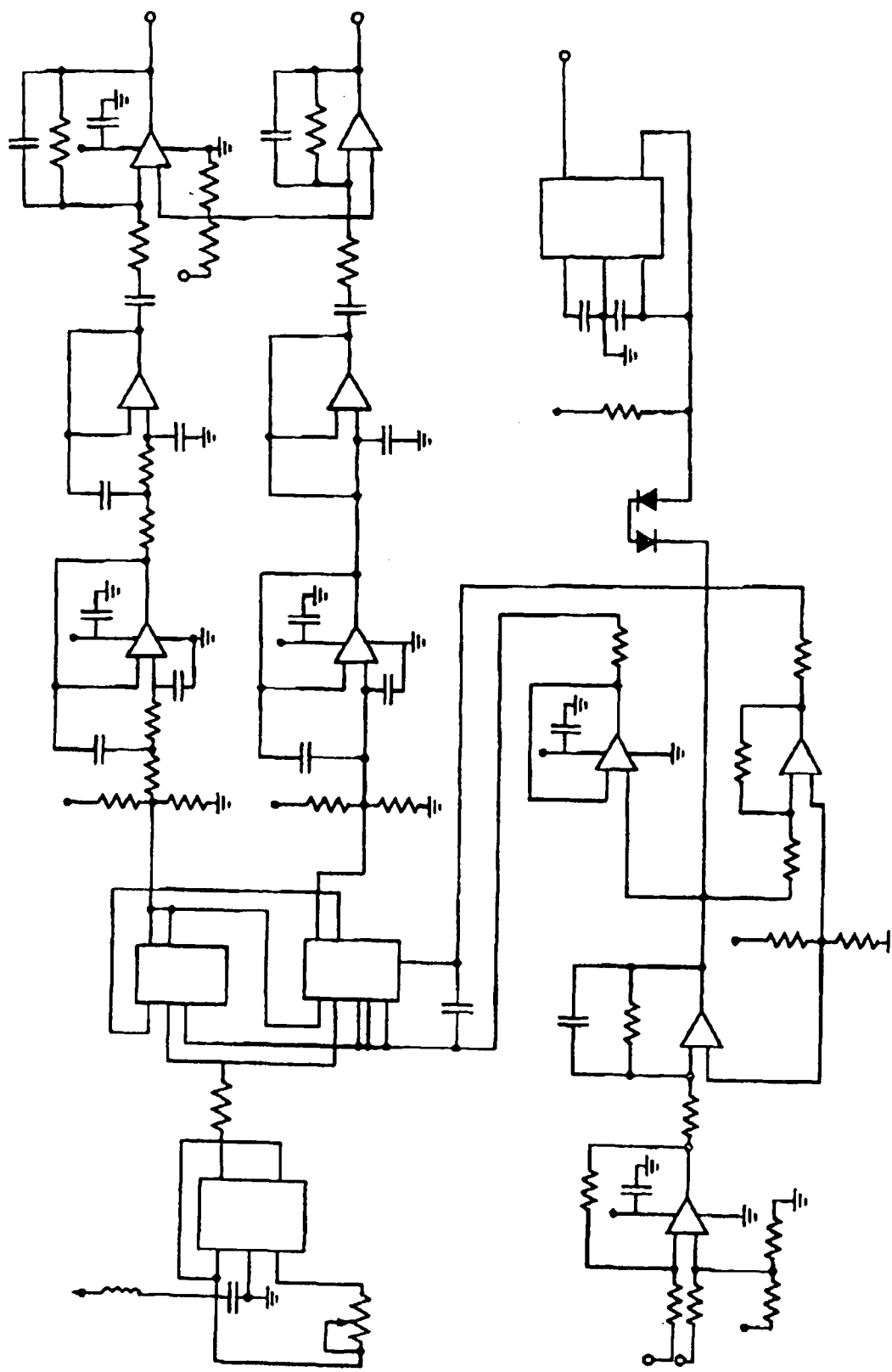
FIG. 37 is a continuation of the diagram of FIG. 36.
Figure 38:
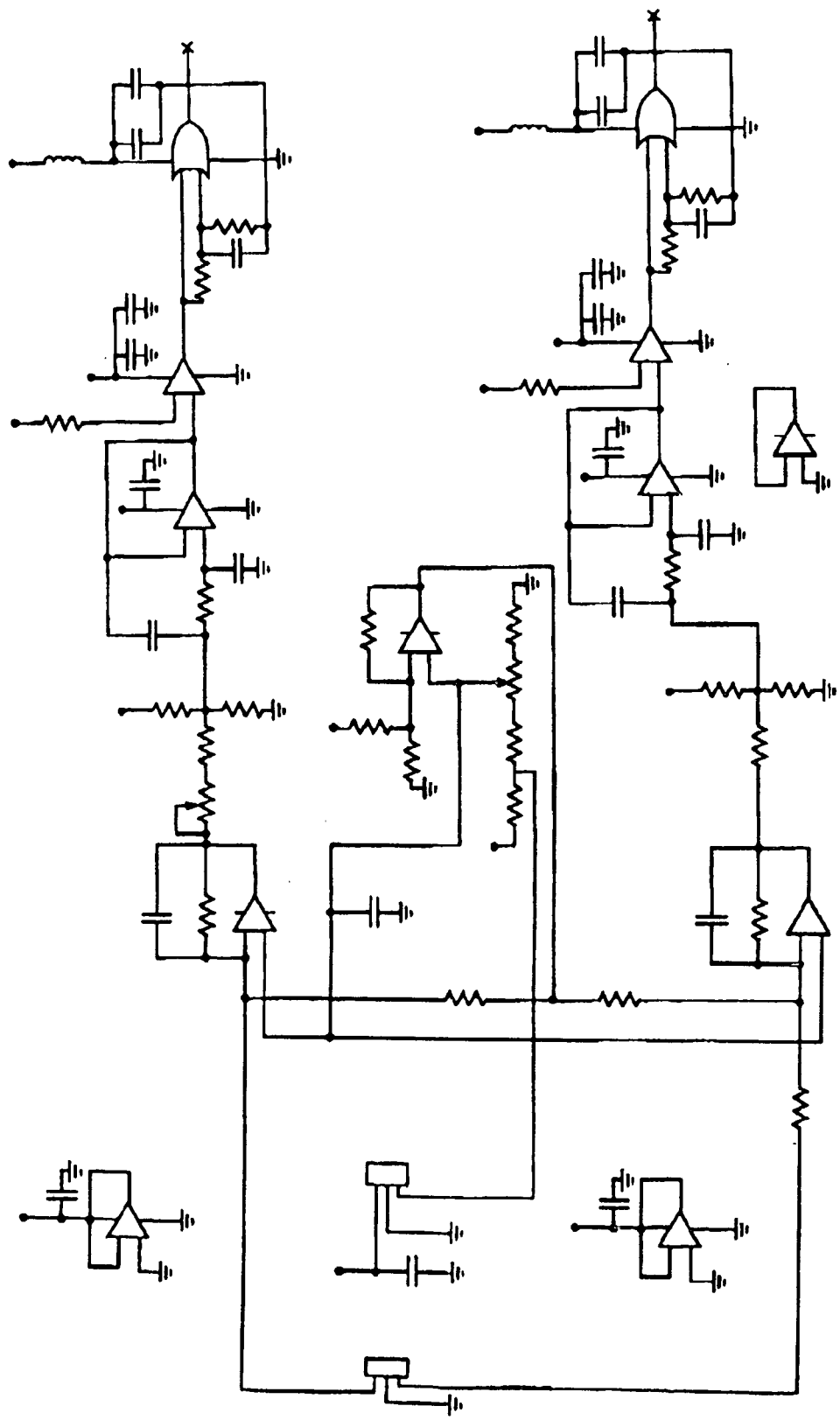
FIG. 38 is a continuation of the diagram of FIGS. 36 and 37.

The circuits in the lower half of FIG. 37 consisting of U10 and U11 are the power supply rejection circuits. These circuits force a symmetric power supply voltage across the D-Flip-flops that is proportional to the high voltage power supply. Since the outputs of the D-Flip-flops swing from

TABLE 3

Characteristics of the various modulators

| | Modulation Technique | # of Levels seen by load | # MOSFET switches required | transitions per carrier period | (transitions/period) per switch pair | |
|---|---|---|---|---|---|---|
| 1 | Tri-Level AM | 3 | 4 | 4 | 2 | |
| 2 | Tri-Level SSB | 3 | 4 | 8 | 4 | |
| 3 | Bi-Level AM | 2 | 2 | 6 | 6 | |
| 4 | Bi-Level SSB | 2 | 2 | 10 | 10 | |
| 5 | SSB (Bi-Level AM × 2) | 3 | 4 | 12 | 6 | Two independent Bi-Level AM modulators |
| 6 | Tri-Level AM (reduced 3rd harmonic) | 3 | 4 | 8 | 4 | This is Bi-Level AM with the 3rd harmonic square wave added. |
| 7 | Bi-Level AM (reduced 3rd harmonic) | 2 | 2 | 10 | 10 | This is Tri-Level AM with the 3rd harmonic square wave added. |
| 8 | SSB (Bi Level AM reduced 3rd × 2) | 3 | 4 | 20 | 10 | |
| 9 | Bi-Level SSB base on A' drive signal | 2 | 2 | 4 | 4 | This technique first described in this document. Has 80 KHz noise component (for 40 KHz carrier |

Figure 33:
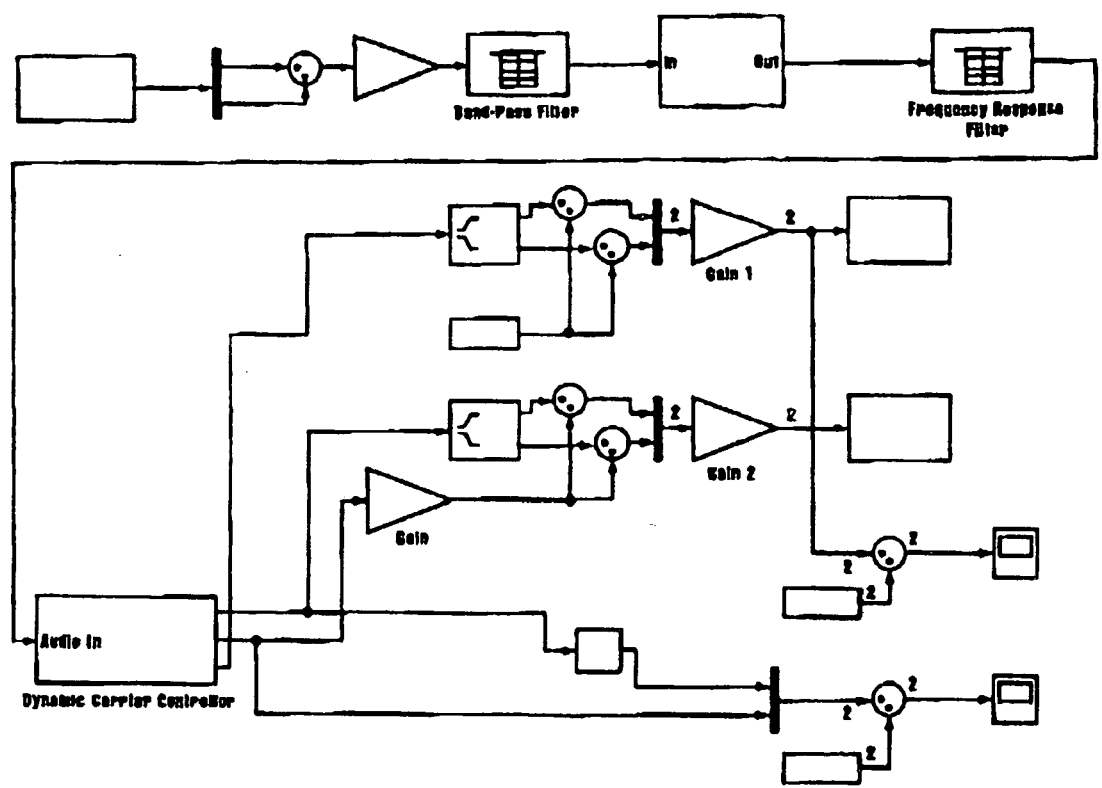
FIG. 33 is a block diagram illustrating a pre-processor in one embodiment.
Figure 34:
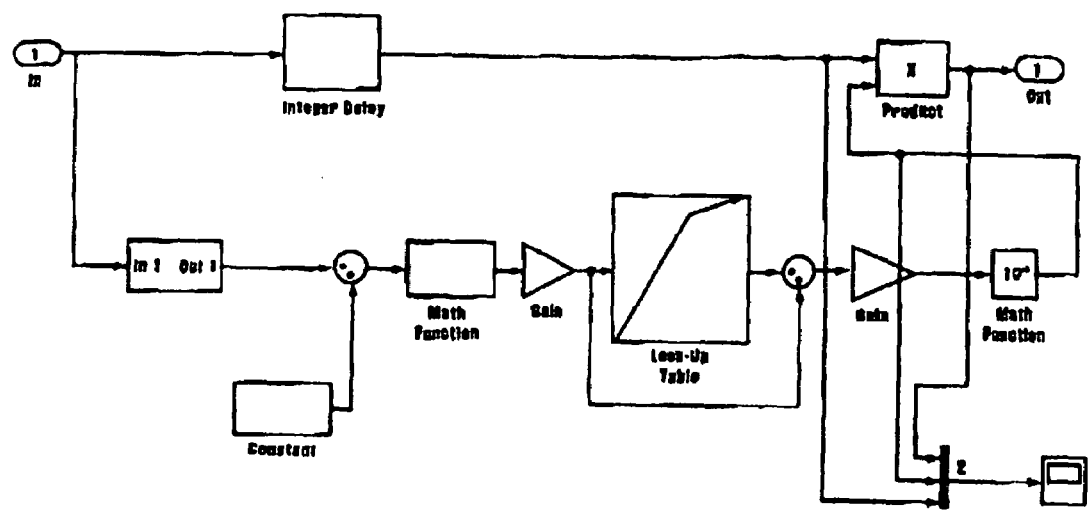
FIG. 34 is a block diagram illustrating a dynamic range compressor component of the system in one embodiment.
Figure 35:
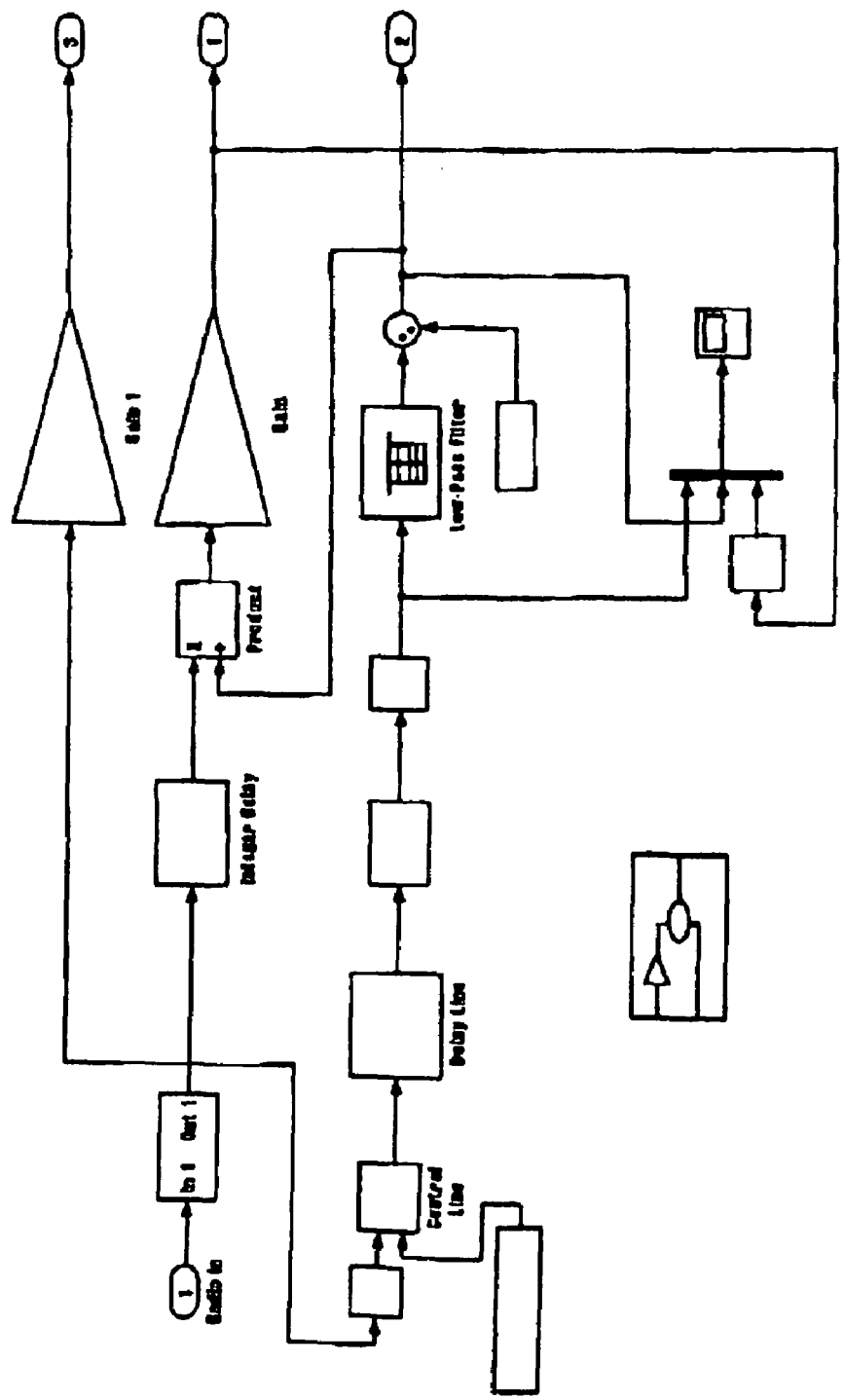
FIG. 35 is a block diagram illustrating a dynamic carrier controller in one embodiment.

Regarding Pre-Processing Software for the Analog ModAmp, The source audio material is processed on a computer to generate an I (in-phase) and Q (quadrature) signals that are saved on the MP3 players right and left channels, respectively. The software is written in MATLAB/Simulink and the block diagrams are shown in FIG. 33, FIG. 34 and FIG. 35.

In another embodiment, an Analog ModAmp Circuit Description is illustrated in FIGS. 36–39. This amplifier accepts analog I and Q signals from an MP3 Player. These signals are DC coupled so the carrier level can be controlled dynamically from the pre-processor software output. An rail-to-rail, the quadrature square wave output amplitudes are proportional to the high voltage supply. And finally, the sine and cosine output amplitudes will be proportional to the high voltage supply, as desired.

The circuit gains are set such that the output sine waves will clip with high input line voltages. This clipping has no negative consequence since the peaks of the waveforms are not used by the subsequent comparator circuits. The increased amplitude in the design increases the overall dynamic range.

A Reset/brown out protection circuit can be provided in one embodiment. The reset chip U22 triggers a 2 second active low reset pulse on power up. If the VCC input drops below 4.00V reset is also asserted. The RESET_F signal, when active, disables the high voltage power supply to the main MOSFETs through the switch, Qa in the power supply schematic, FIG. 36. This system is used to delay the power-up of the main MOSFETs until the 5V supply has stabilized and the MOSFET drive signals are valid. This circuit also shuts down the MOSFET power supply under brown-out conditions where the AC line is below about 80VAC. The design performs the brown-out reset using the diodes D4 to drag down the reset chip's VCC input when the high voltage supply droops. This reset behavior is important since the sine wave reference signals are proportional to the high voltage and lowered reference signals would eventually lead to invalid control waveforms at the comparator outputs.

The inputs to the ModAmp consists of in-phase and quadrature audio signals with DC controlling the carrier level. The circuits of U12, U17 and U14B in FIG. 14 take the MP3 player input and generate a hard-limited (0 to 5V) signal the is nominally at +5V/2 (2.5V) with no input signal. Clipping excessive input levels is critical at this stage to avoid invalid comparator outputs in the subsequent circuits.

The op-amp circuit design takes the ratiometric signal from the MP3 player output (the DAC in the player is proportional to the 2.47V reference times the digital code) and generates an output that drops below the nominal 2.5V as the carrier level increases. The circuit is designed to cancel the offset voltage errors that would normally occur with +5V power supply variations.

Regarding PanComparator Circuits included in the illustrated embodiment, the 15 KHz 2nd order Bessel lowpass filter U14A and U19A removes high frequency signals that may be in the input and drives the negative comparator inputs. The top comparator output has falling and rising edges that correspond to the times that the output MOSFETs should be cleared. See the wave forms in FIG. 25 (I and Q are flipped so the ModAmp performs lower sideband modulation). Similarly the lower comparator's edges correspond to times when the output MOSFETs should be set.

Figure 39:
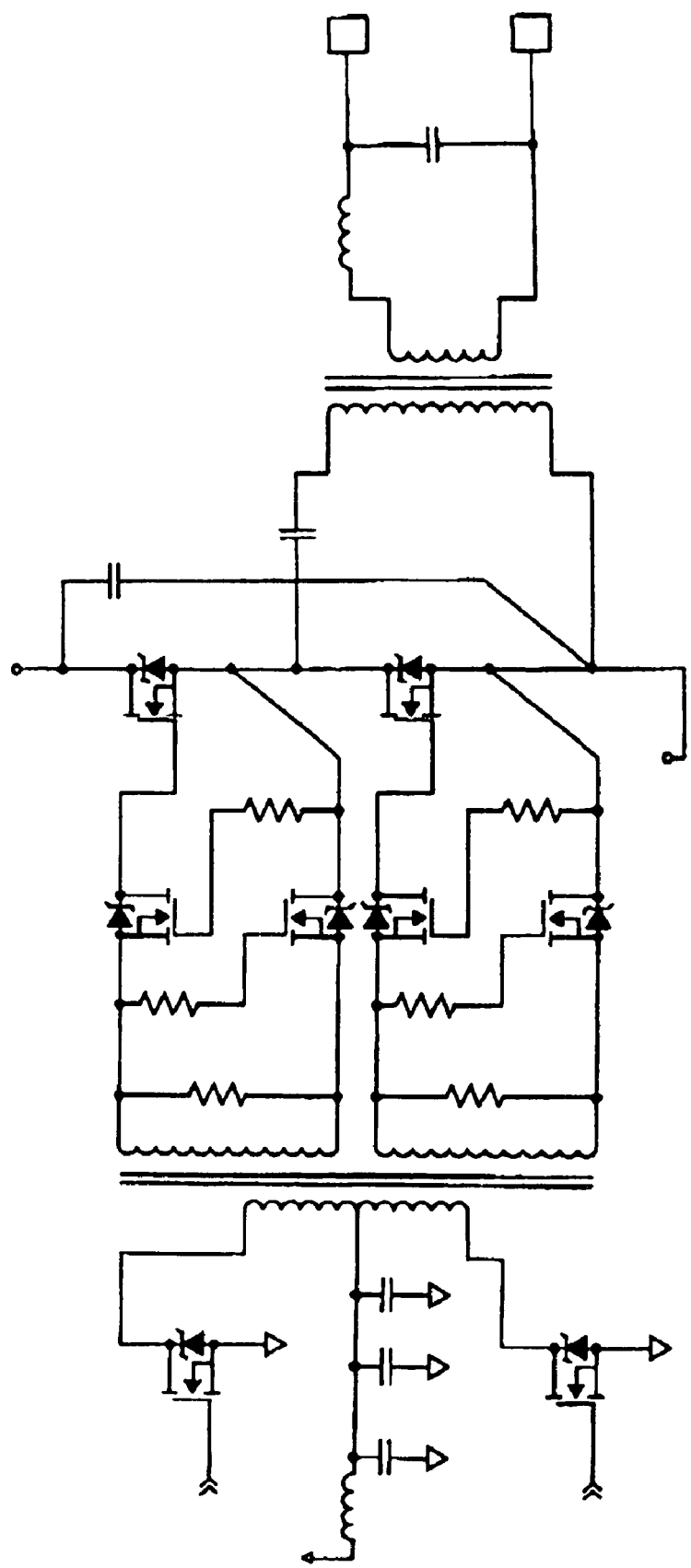
FIG. 39 is a continuation of the diagram of FIGS. 36–38.

Regarding Pulse Synthesizer Circuits, the outputs of the comparators are fed to an edge detector circuit that generates a short 350 nS pulse on both the positive going and negative going comparator transitions. These "event trigger" signals are used to set and clear the output state. Also pulse driver circuits are provided. FIG. 39 shows the A-set and A-clear event trigger pulses controlling the gates of Q1 and Q2. Next, Q1 and Q2 drives T3 in push-pull mode. The secondaries of T3 have a series of short alternating negative and positive going pulses with an amplitude of about +/−10V.

Now considering MOSFET Pulse to Level Converters and Output Stage, for each main MOSFET is driven by a pair of steering MOSFETs (Q3,Q4 and Q5,Q6) which converts the short event trigger pulses to steady-state voltage levels. By using MOSFETs with different gate thresholds and the secondary-to-secondary coupling in the pulse transformer, this novel circuit design guarantees that the main MOSFETs will avoid cross-conduction (or shoot through) and will operate over a wide duty cycle range.

Lastly a Transducer Isolation and Matching Stage is provided. Transformer T4 achieves the required transducer isolation from the mains and the matching inductor and capacitor form a tuned circuit with the transducer to help boost the voltage level and equalize the system.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the claims.

The invention claimed is:

1. A modulator-amplifier configured for use in parametric sound reproduction systems for reproducing audio information in a medium, comprising:
   an input configured for receiving at least one input signal including audio information;
   at least one reference signal generator configured for generating at least one reference signal;
   at least one comparator coupled to the input and the reference signal generator configured for detecting a relationship between a first signal based on the at least one input signal and the at least one reference signal and generating a second signal based thereon;
   at least one switching power stage coupled to the at least one comparator and configured to receive the second signal and drive an output signal including at least one sideband and audio information; and
   wherein the relationship between the at least one input signal and the timing of state transitions in the switching power stage is non-linear.

2. A modulator-amplifier as set forth in claim 1, wherein the medium comprises air.

3. A modulator-amplifier as set forth in claim 1, wherein the medium comprises water.

4. A modulator-amplifier as set forth in claim 1, wherein the output signal comprises two sidebands.

5. A modulator-amplifier as set forth in claim 1, wherein the output signal comprises two sidebands and satisfies at least one condition of a) the audio information being divided between the two sidebands unevenly and b) the strength of the signal is divided between the two sidebands unevenly.

6. A modulator-amplifier as set forth in claim 1, wherein the modulator-amplifier is configured for either single sideband (SSB) or double sideband (DSB) modulation.

7. A modulator-amplifier as set forth in claim 1, wherein the second signal is one of bi-level, tri-level, 4-level, and 5-level.

8. A modulator-amplifier as set forth in claim 1, wherein the at least one reference signal has a periodic waveform that is one of sinusoidal, triangle and rectiform.

9. A modulator-amplifier as set forth in claim 1, wherein the modulator-amplifier is implemented with analog electronic components.

10. A modulator-amplifier as set forth in claim 1, wherein the modulator-amplifier is implemented with at least one digital electronic component.

11. A modulator-amplifier as set forth in claim 10, wherein the at least one digital electronic component comprises a gate array.

12. A modulator-amplifier as set forth in claim 11, wherein the gate array is field-programmable.

13. A modulator-amplifier as set forth in claim 1, wherein the at least one reference signal generator further comprises a carrier level controller, whereby output power can be varied by varying the amplitude of the at least one reference signal.

14. A modulator-amplifier as set forth in claim 1, wherein output power can be varied by varying amplitude of the output signal.

15. A modulator-amplifier as set forth in claim 14, wherein the output power can be adjusted by adjusting a voltage swing between states in the at least one switching power stage.

16. A modulator-amplifier as set forth in claim 1, wherein output signal amplitude is multiplied by an integer value in the at least one switching power stage.

17. A modulator-amplifier as set forth in claim 1, further comprising a signal processor in communication with the input which generates a level signal based on the level of the at least one input signal, wherein the at least one reference signal is amplitude modulated in accordance with the level signal.

18. A modulator-amplifier as set forth in claim 17, wherein the at least one reference signal generator modulates amplitude of the at least one reference signal based upon the at least one input signal, thereby adjusting power in the output signal.

19. A modulator-amplifier as set forth in claim 1, wherein a switching frequency of the switching power output stage is less than ten times a frequency of the at least one reference signal.

20. A modulator-amplifier as set forth in claim 19, wherein the switching frequency of the switching power output stage is less than 6 times the frequency of the at least one reference signal.

21. A modulator-amplifier as set forth in claim 1, wherein the non-linear relationship is based on an arcsine function.

22. A modulator-amplifier as set forth in claim 1, wherein the non-linear relationship is selected to minimize switching-induced distortion of audio information in the output signal.

23. A modulator-amplifier as set forth in claim 1, wherein the at least one input signal comprises a sinusoidal waveform.

24. A modulator-amplifier as set forth in claim 1, wherein the at least one input signal comprises an in-phase signal and a quadrature signal.

25. A modulator-amplifier as set forth in claim 1, further comprising a protection circuit coupled to the at least one switching power stage configured for resetting or turning off the at least one switching power stage when input power deviates from a pre-selected range of parameter values.

26. A modulator-amplifier as set forth in claim 1, wherein the modulator-amplifier is operable as one of:
a band-pass amplifier;
a part of one of an AM transmitter and SSB transmitter;
a part of a SONAR system;
a part of a diagnostic ultrasound system; and
a frequency translating amplifier.

27. A modulator-amplifier as set forth in claim 1, wherein output signal switching occurs at one of 2, 3, 4, 5 and 6 times a frequency of the at least one reference signal.

28. A modulator-amplifier as set forth in claim 1, wherein the output signal comprises at least one of an upper sideband, a lower sideband, both upper and lower sideband.

29. A modulator-amplifier configured for use in parametric sound reproduction systems, comprising:

a reference signal generator for generating a reference signal;
an event detector-signal generator comprising at least one comparator configured for comparing an input signal with the reference signal and generating a timing signal based upon detected events in the input signal;
a switching power output stage configured for modulating the reference signal based upon the timing signal, whereby signal modulation is integrated with power amplification of the signal to embody a non-linear relationship between the input signal and the timing of state transitions in the modulator-output stage.

30. A modulator-amplifier as set forth in claim 29, wherein said non-linear relationship comprises an arcsine function.

31. A modulator amplifier as set forth in claim 29, wherein the reference signal is one of lower-sideband, upper-sideband or dual-sideband modulated.

32. A modulator-amplifier as set forth in claim 29, wherein the number of steady state levels in said switching power output stage is selected from the group consisting of: 2, 3, 4 or 5.

33. A modulator-amplifier as set forth in claim 32, wherein switching within the switching power output stage occurs at one of 2, 3, or 4 times the frequency of the reference signal.

34. A modulator-amplifier as set forth in claim 29, further comprising a power supply rejection circuit configured to mitigate variations in a supply voltage.

35. A modulator-amplifier, comprising:
a carrier signal generator;
an event detector configured to generate a state change signal based upon detected events in an audio input signal, said event detector comparing the input signal to a reference signal;
a modulator-switching power output stage configured for modulating a carrier for parametric sound reproduction based upon the state change signal, and wherein the timing of switching between steady state levels in said output stage is related to the audio input signal by a non-linear function; and
wherein the switching frequency is selected from the group consisting of 2, 3, and 4 times the carrier frequency.

36. A modulator-amplifier as set forth in claim 35, wherein the number of steady state levels is one of 2, 3, 4, and 5.

37. A modulator-amplifier as set forth in claim 35, wherein the reference signal can be suppressed and the modulator amplifier-operated as a band-pass amplifier.

38. A modulator amplifier as set forth in claim 35, configured for use in a SONAR application.

39. A modulator-amplifier as set forth in claim 10, comprising an application specific integrated circuit (ASIC).

* * * * *